(12) United States Patent
Golan et al.

(10) Patent No.: US 8,080,856 B2
(45) Date of Patent: Dec. 20, 2011

(54) PHOTOELECTRIC STRUCTURE AND METHOD OF MANUFACTURING THEREOF

(75) Inventors: Gady Golan, Hod Hasharon (IL); Alex Axelevitch, Bat Yam (IL); Ronen Shavit, Tel-Aviv (IL)

(73) Assignees: Gady Golan, Hod Hasharon (IL); Alex Axelevitch, Bat Yam (IL); Ronen Shavit, Tel-Aviv (IL)

( * ) Notice: Subject to any disclaimer, the term of this patent is extended or adjusted under 35 U.S.C. 154(b) by 196 days.

(21) Appl. No.: 12/552,393

(22) Filed: Sep. 2, 2009

(65) Prior Publication Data

US 2010/0052089 A1 Mar. 4, 2010

Related U.S. Application Data

(60) Provisional application No. 61/190,592, filed on Sep. 2, 2008.

(51) Int. Cl.
 *H01L 31/102* (2006.01)
(52) U.S. Cl. ............ 257/458; 257/72; 257/79; 257/80; 257/428; 257/440; 438/48; 438/60; 438/72; 438/73; 438/84
(58) Field of Classification Search ................ None
See application file for complete search history.

(56) References Cited

U.S. PATENT DOCUMENTS 4,072,541 A * 2/1978 Meulenberg et al. ......... 136/255

FOREIGN PATENT DOCUMENTS

WO 03/077283 A2 9/2003

OTHER PUBLICATIONS

International Search Report, mailed Mar. 4, 2010, from counterpart International Application No. PCT/IL2009/000848.
Catchpole, K. R. et al., "Modeling a monolithically integrated vertical junction cell in low and high injection", Progress in Photovoltaics. Research and Applications, vol. 11, No. 2, Mar. 1, 2003, pp. 113-124.
Deenapanray, P. N. K. et al., "Reactive ion etching of dielectrics and silicon for photovoltaic applications", Progress in Photovoltaics. Research and Applications, vol. 14, No. 7, Nov. 1, 2006, pp. 603-614.
Franklin, E. et al., "Silver Solar Cells," Proc. SPIE, vol. 6800, Dec. 21, 2007, pp. 680010-1-680010-11.
Menard, E. et al., "Bendable single crystal silicon thin film transistors formed by printing on plastic substrates," Applied Physics Letters 86, 2005, pp. 093507-1-093507-3.

(Continued)

*Primary Examiner* — Fernando L Toledo
*Assistant Examiner* — Kyoung Lee
(74) *Attorney, Agent, or Firm* — Houston Eliseeva, LLP;

(57) ABSTRACT

A photoelectric structure is presented, comprising one or more PiN cells. The PiN cell is formed by an intrinsic semiconductor bulk having front and rear surfaces enclosed between p- and n-type regions extending along side surfaces of said semiconductor bulk. The front and rear surfaces of the intrinsic semiconductor bulk are active surfaces of the PiN cell and said side surfaces of said semiconductor bulk formed with said p- and n-type regions are configured and operable for collecting excess charged carriers generated in said semiconductor bulk in response to collected electromagnetic radiation to which at least one of the active surfaces is exposed during the PiN cell operation.

19 Claims, 18 Drawing Sheets

OTHER PUBLICATIONS

Weber, K. J. et al., "A novel low-cost, high-efficiency micromachined silicon solar cell," IEEE Electron Devices Letters, vol. 25, No. 1, Jan. 1, 2004, pp. 37-39.

Weber, K. J. et al., "Sliver solar cells," Photovoltaic Specialists Conference, 2005. Conference record of the Thirty-First IEEE Lake Buena Vista, FL, USA Jan. 3-7, 2005, Piscataway, NJ, USA, IEEE, US, Jan. 3, 2005, pp. 991-995.

* cited by examiner (General Art)

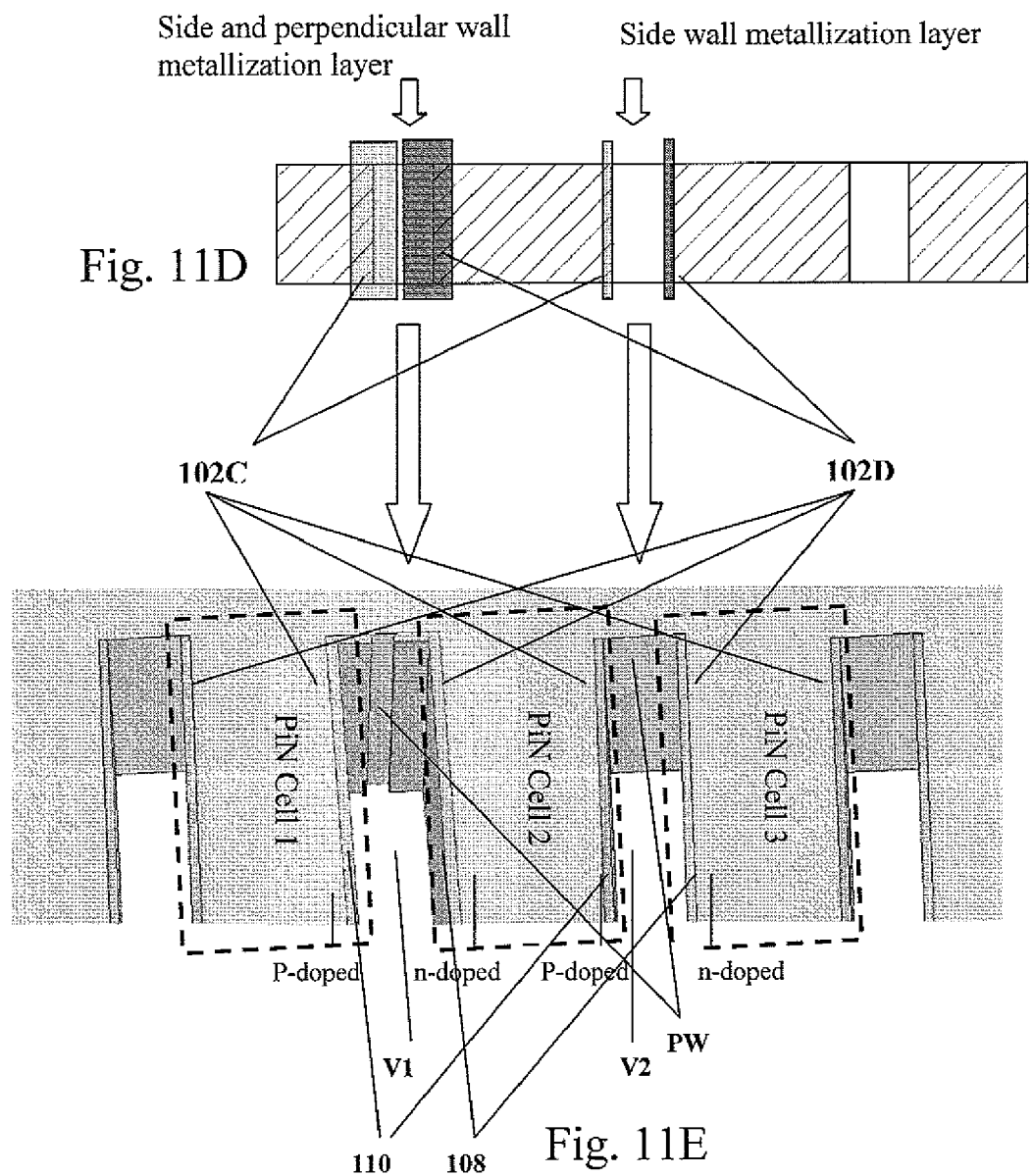

PHOTOELECTRIC STRUCTURE AND METHOD OF MANUFACTURING THEREOF

RELATED APPLICATIONS

This application claims the benefit under 35 USC 119(e) of U.S. Provisional Application No. 61/190,592 filed on Sep. 2, 2008, which is incorporated herein by reference in its entirety.

FIELD OF THE INVENTION

This invention is generally in the field of photoelectric devices utilizing the principles of a photoelectric effect, such as solid state photodetectors, photovoltaic cells, photodiodes, etc., and relates to a photoelectric device utilizing a PiN structure, and a method of manufacturing thereof.

BACKGROUND OF THE INVENTION

Photoelectric structure is a structure whose electrical characteristics (e.g., current, voltage, or resistance) vary when electromagnetic radiation is incident upon it, as a result of a generation of electron-hole pairs in the structure caused by its interaction with said radiation. Such photoelectric structures are used in various semiconductor-based devices including photovoltaic type devices capable of converting solar or other thermal (infrared) energy directly into electricity, and photoemissive type devices wherein charge particles (e.g. electrons, electron-hole pairs) are generated/emitted in response to input electromagnetic radiation.

The conventional approach to the configuration of photoelectric semiconductor-based devices consists of the use of P-N junction(s) for the generation of free charged carriers (e.g. electron-hole pairs) generated by the photoelectrical effect. The charged carriers are generated in all parts of the photoelectric structure: at the emitter (N-type part), at the base (P-type part) and at the so-called "depletion region" within the interface function) between the P- and N-doped layers in response to interaction with incident photons. However, only a little fraction of the electron-hole pairs generated at the emitter and the base regions can be collected. This is due to a high recombination rate in these regions. Thus, practically, the quantity of the charged carriers generated only in the depletion region defines the efficiency of the generation process and the possibility to collect these charged carriers. The generated charge carriers are forced to move through and away from the depletion region due to a built-in electric field existing in this region. More specifically, an electric field exists in the depletion region due to difference in the concentration of electrons and holes at both P and N parts of this region and due to the consequent diffusion of the charge carriers which tends to equilibrate these concentrations. This diffusion creates an internal electric field which eventually stops the diffusion and defines the depletion region dimensions and the internal electric field across this region. At this stage, newly generated charged carriers are separated and drifted in a suitable direction: electrons to the emitter (N) and holes to the base (P).

According to the conventional approach for building P-N junction based solar cells and also or P-i-N based photodiodes, the junction(s) containing structure is a stack of layers of different type conductivity stacked along an axis of light propagation through the photovoltaic cell, such that light passes across the junction(s). In other words, these existing structures are all the so-called "vertical" structures in which the generated charged carriers travel along the same direction as the photons being absorbed within the junction. Also, typically, Ohmic contacts are located on both sides of the cell to be above and below the junction(s), e.g. being in the form of a grid. Such Ohmic contacts, even if being in the form of a grid, reduce the effective surface area (exposed to interaction with photons) of the light collection surface.

Referring to FIG. 1, there is shown a cross sectional view of a bifacial photovoltaic cell structure (the figure is extracted from V. Everett et al., "Sliver Solar Cells", http://solar.anu.edu.au/docs/Silver %20cells %20060621.ppt). The cell includes a slice of a conventional silicon p-type wafer. This p-type wafer has two Ohmic contacts associated with heavily doped regions, Boron-doped (p-type doping) on one side and Phosphor-doped (n-type doping) on all other surfaces of the slice. The active surfaces are the P-N junctions formed by interfaces between the p-type wafer and n-doped wrapping layer at other sides of the p-type wafer. When the cell is put in operation the P-N junctions thus serve as the active surface extending vertically along the optical path of light to which the cell is exposed.

Various semiconductor and compound semiconductor materials are quite useful in making photoelectric devices of the kind specified. Such materials, for example, are silicon, germanium, gallium arsenide, indium arsenide, indium antimonide, etc. Various semiconductor materials and/or different doping of the same semiconductor material provide higher sensitivity of a P-N junction in said material to a different spectrum of electromagnetic radiation. This property is used in various applications, for example it is known to build an array of photovoltaic cells with different spectral sensitivity (e.g. hetero-junctions).

Thus, the existing photovoltaic cells (or solar cells) as well as photodiodes, typically utilize a large-area P-N junction or P-i-N junctions, which is capable of generating usable electrical energy from light sources, including sunlight. These cells are typically—p-doped silicon wafer-based structures, for example prepared by the known technique utilizing sawing to wafers the Czochralski pulled ingots following the pulling process. Average impurity concentration (degree of doping) of these wafers (P-type silicon (boron doped) which is generally used for solar cells), serving as a baseline for the preparation of a P-N junction, is about $10^{16}$-$10^{17}$ cm$^{-3}$. Thus, the measured resistivity of a wafer is about 0.1-1 Ωcm.

SUMMARY OF THE INVENTION

There is a need in the art in a novel photoelectric structure enabling maximum utilization of the semiconductor materials. Such need is associated with the following: The main drawback of the known photoelectric devices (e.g. solid state solar cells and photodiodes) is associated with their high cost, relative to the fossil fuel cost (3-6 $/W generation cost for a solar cell system, vs. 1 $/W generation cost for a fossil fuel system). Also, the conversion efficiencies of conventional solar cell systems are quite low, i.e. about 10%-17%. Moreover, the effectivity of conventional photoelectric devices is highly dependent on the temperature conditions of the environment which increases the effects of charge carriers recombination mechanisms (such as surface state recombination and Shockley Reed Hall (SRH) recombination), thus reducing the device efficiency with the increase in its operational temperature.

The inventors have found that these drawbacks are associated with the conventional approach to the configuration and operation of a photoelectric device, namely passing light across different-type conductivity layers (e.g. through P-N junctions). The efficiency of operation of a device of the kind specified (semiconductor-based photoelectric device) is dependent, inter alia, on the dimensions of a depletion region in the vicinity of the P-N interface/junction. The width dimension of the depletion region, from both sides of the P-N interface (i.e. along the direction of the internal electric field generated within this region), is associated with (e.g. equal to) the diffusion lengths of the excess minority charged carriers in the emitter (N) and base (P) from both sides of the junction. In the conventional devices, a depletion region (corresponding to interface/junction of different conductivity layers; e.g. P-N junctions) operates as an active region in which conversion of photons into charged carriers occurs. Hence, according to the conventional approach, the operational mechanism of a photoelectric device is based on the creation of an active region, in which conversion of photons into charged carriers occurs, which is associated with a depletion region existing in the junction/interface region between the different-type conductivity layers (P-N junction); and accordingly requiring the junction/interface to extend perpendicular to the light propagation path or in other words such that the internal electric field is directed along the light propagation path (vertical configuration). As mentioned above, in photodiodes, another example of the conventional vertical configuration is a P-i-N junction based photodiode, in which P-i-N junction is used, rather than P-N junctions, because the use of an intrinsic layer requires a reverse bias for the photodiode, which allows for increasing the depletion region allowing a larger volume for electron-hole pair generation and reduces the capacitance thereby increasing the bandwidth.

The depletion region at the interface between the different-type conductivity layers has high resistivity since all of the free charged carriers leave this region due to the built-in electric field at the junction. This high resistivity leads to an increase in the probability of charge carriers' generation. Propagation of these charge carriers through multiple layers of different conductivity properties (e.g. different structures) and through interfaces between them increases effects of recombination processes associated with such mechanisms as surface state recombination, and crystalline defects namely trap recombination (Shockley-Reed-Hall recombination). This leads to reduction in the photoelectric conversion efficiency, of the conventional (namely vertical) photovoltaic structures and photodiodes in which the charge carriers, generated within the depletion region, propagate across the junction of different conductivity type structures.

Also, as noted above, the efficiency of a conventional photovoltaic device is highly influenced by the temperature of the device. Increasing the temperature leads to an increase in the intrinsic charge carriers concentration $n_i$ (proportional to $T^{3/2}\exp(-E_g/2kT)$, T being the temperature, k being the Boltzmann coefficient, and $E_g$ being the bandgap of the used semiconductor). These processes reduce the excess free charge carriers generated by light absorption and as a consequence reduce the photoelectric conversion efficiency. The present invention solves the above problems by providing a photoelectric structure constructed and operable according on a novel approach. The structure comprises one or more PiN cells, where the PiN cell is configured as a lateral structure (in the meaning of orientation of its active region with respect to a direction of light propagation and a direction of an internal electric field). Such PiN cell is formed by an intrinsic (i.e. i-type) (preferably single-crystalline) bulk of semiconductor material which entirely presents an active region of the PiN cell, in which excess charge carriers are created in response to photon absorbance therein. This novel approach is based on the inventors' understanding that the efficiency of a photoelectric device could be increased by enlarging the depletion region. The conventional approach is bound by the fact that dimensions (specifically the width) of the depletion region are defined by the P-type and N-type doping concentrations at the emitter and base parts. In the invention, an active region is constituted by a semiconductor intrinsic bulk, and a PiN structure using such active region is configured as a lateral structure.

It should be understood that for the purposes of the present application, the meaning of term "bulk" should not be limited to relatively large volumetric structures but rather should refer to the volume of any semiconductor crystalline structure (thick one or thin-film like) which is characterized by a single material composition with no interfaces between different material compositions.

The PiN structure includes front and rear surfaces, or generally at least one of the front and rear surface, of a semiconductor intrinsic bulk, which surface(s) is/are active surface(s), namely light collection surface(s) by which the cell is exposed to electromagnetic radiation while in operation. The PiN structure is formed by making p- and n-type regions on the side surfaces of the intrinsic semiconductor bulk, thus defining an electric field direction along a major axis substantially parallel to the light collection surface, i.e. substantially perpendicular to the input radiation propagation. It should thus be understood that in the invented structure, an internal electric field created within the intrinsic semiconductor bulk, due to the P- and N-type regions at the side surfaces, is a lateral field, traverse to a general light incident/collection direction.

Ohmic contacts are made to the p- and n-type regions, e.g. by metal coatings thereon. These metal coatings serve for collecting the excess charge carriers generated in said bulk semiconductor in response to the collected electromagnetic radiation to which at least one of the active surfaces is exposed during the PiN cell operation.

It should be noted that the terms radiation and electromagnetic radiation used herein refer to light or thermal radiation. Therefore, the photoelectric structure of the present invention may be used in a photovoltaic excitation mode (by interaction with photons) as well as in a thermal excitation mode (by interaction with phonons).

Keeping in mind that the intrinsic semiconductor bulk is crystalline bulk and is thus characterized by a major axis presenting a direction of the highest mobility of the charge carriers in the crystal, which is more essential for a single-crystalline material where such major axis is perpendicular to the basic crystal planes, in the invented structure the major axis extends laterally between the P- and N-type regions and is thus substantially parallel to the light collection surface, i.e. substantially perpendicular to a general propagation direction of light to which said intrinsic semiconductor bulk is exposed.

The photoelectric cell is made of a substantially intrinsic semiconductor material (i.e. with doping substantially not exceeding $10^{14}$ cm$^{-3}$) which is preferably single-crystalline semiconductor. Preferably, the semiconductor bulk is a single-crystalline 100-plane crystal (to reach maximum lifetime of the charge carriers, i.e. the maximal charge carriers mobility along the direction of the internal electric field), or may generally be a 110 or 111 plane crystal.

The PiN cell of the present invention is configured such that, the width dimension of each of the p and n doped regions of the cell is much smaller (practically negligible) relative to that of the active region (intrinsic semiconductor bulk) in which charge carriers are generated. This provides for increasing the effective active region of the cell of a given lateral dimension thus increasing the efficiency of the cell. However, in order to facilitate collection of the charge carriers, produced in the relatively large active region, a desirably high internal lateral electric field is created. These conditions are achieved by respectively, appropriate selection of a ratio between the active region size and the doped region size (the minimal value of such ratio is generally of the order of 100, but preferably such ratio is at least about 1000), and selection of appropriate level of doping of the p- and n-doped regions (concentration of about ~$10^{19}$-$10^{21}$ cm$^{-3}$—degenerated level of concentration). High doping concentration in the doped regions, and the low charge carriers concentration in the active region (in the intrinsic region), create high internal electric field (for example of the order of $10^5$ V/cm, e.g. about $1.3*10^5$ V/cm); such internal field is strong enough to sweep the generated excess charge carriers towards the charge carriers collecting region (collecting electrode associated with the respective doped region). Since the charge carriers move transversally to the photons fall direction (general light incident direction), the photoelectric structure of the present invention is a "lateral" structure, which is contrary to the conventional "vertical" approach.

Thus, according to one broad aspect of the invention, there is provided a photoelectric structure comprises one or more PiN cell, wherein the PiN cell is formed by an intrinsic semiconductor bulk having front and rear surfaces enclosed between p- and n-type regions extending along side surfaces of said semiconductor bulk; the front and rear surfaces of the intrinsic semiconductor bulk being active surfaces of the PiN cell and said side surfaces of said semiconductor bulk formed with said p- and n-type regions being configured and operable for collecting excess charged carriers generated in said semiconductor bulk in response to collected electromagnetic radiation to which at least one of the active surfaces is exposed during the PiN cell operation.

The p- and n-type regions, extending along the side surfaces of the intrinsic semiconductor bulk, are configured and operable as a source of an internal lateral electric field within the intrinsic semiconductor bulk enabling propagation of the generated charge carriers to the p- and n-type regions where they can be collected using Ohmic contacts. In other words, the p- and n-type regions provide for creating an internal lateral electric field to enable collection of the excess charged carriers generated in the intrinsic semiconductor bulk in response to the electromagnetic radiation collected through the at least one of the front and rear surfaces while the intrinsic semiconductor bulk is being subjected to the lateral electric field.

Preferably, the intrinsic semiconductor bulk is made of a single-crystalline material in either one of 100, 010 and 001 orientation.

According to the invention, the configuration of the PiN cell is such that a major axis of the PiN cell, being an axis of highest mobility of the charge carriers in the intrinsic semiconductor bulk, is substantially perpendicular to a general propagation direction of light to which this PiN cell is exposed. The major axis of the PiN cell is an axis along a direction of the internal lateral field, i.e. is an axis intersecting the p- and n-type regions, and thus substantially parallel to the at least one light collection surface.

Preferably, the configuration is such that the major axis is substantially parallel to a main crystallographic axis of the semiconductor bulk, e.g. a 100-plane semiconductor bulk.

Preferably, the p- and n-type regions extending along the side surfaces of the intrinsic semiconductor bulk are doped regions in said intrinsic semiconductor bulk. Preferably, a level of doping of the p- and n-type regions and a width of the intrinsic semiconductor bulk in between said p- and n-type regions are selected to create the large enough lateral internal electric field to enable drift of the charged carriers into Ohmic contacts at the p- and n-type regions. The level of doping of said p- and n-type regions is preferably selected to create the lateral internal field of the order of $10^5$ V/cm, e.g. of about $1.3*10^5$ V/cm.

For example, a width of each of the p-type and n-type regions is about 1 μm, and the p-type and n-type regions are heavily doped having a dopant concentration of about $10^{19}$-$10^{21}$ cm$^{-3}$ in a depth of about 1 μm. More generally, the width of the doped regions may be in the range of 0.5 μm to 3 μm.

According to the invention, each of the front and rear surface has a width much larger than a width of each of the p- and n-type regions. Preferably, a ratio between the width of each of the front and rear surfaces of the intrinsic semiconductor bulk and the width of each of the p- and n-type lateral regions is at least 1000.

The PiN cell may have a substantially rectangular geometry of a thickness of about 20-400 μm, width of about 0.5-2.0 cm (generally up to 50 cm). The PiN cell may be of a length of about 1-15 cm length. In some embodiments of the invention, the PiN cell has a curved geometry of a substantially rectangular cross section.

In some embodiments, the photoelectric structure is configured such that both of the front and rear surfaces of the PiN cell are the active surfaces of the cell. The photoelectric structure is thus configured and operable for bi-facial light collection. In the case of multi-cell configuration where the cells are stacked one on top of the other, the front surface of the uppermost cell and the rear surface of the lowermost cell present front and rear light collection surfaces of the entire structure.

The photoelectric structure may include an array of the PiN cells, at least some of said PiN cells being electrically connected to one another. At least two of the electrically connected PiN may have a common Ohmic-type contact on the p-type regions or n-type regions thereof.

The multiple PiN cells may be located one on top of the other interfacing via the active surfaces thereof. The intrinsic semiconductor bulks may be kept one on top of the other by thermo-conductive glue layers. In this case, materials of the semiconductor bulks and the glue layers are selected to provide a predetermined refractive index profile through the structure. In some other embodiments, the multiple PiN cells are arranged in a spaced-apart relationship along a common plane.

The either one of the above embodiments, the PiN cells may have the semiconductor bulks made of semiconductor materials of different energy band gaps respectively absorbing different spectral parts of the electromagnetic radiation. The photoelectric structure of the present invention may be made of various materials, absorbing various parts of the spectral radiation e.g. germanium, silicon, and gallium arsenide, which may be electrically connected to achieve the required generating power. In some embodiments, the photoelectric cells are prepared from semiconductor materials with bandgaps selected to cover almost all the electromagnetic radiation spectrum in approximately equal parts. For example: germanium or gallium antimonide for the infra-red part of the spectrum referred herein and thereafter as a R-cell, silicon for the red and near infra-red part of the spectrum referred herein and thereafter as G-cell, gallium arsenide or zinc selenide for the visible and near ultra-violet part of the spectrum referred herein and thereafter as B-cell.

In some examples of the invention, at least one optical window is provided being associated with the at least one light collection surface of the PiN cell(s), to allow access of the light collection surface(s) by the electromagnetic radiation.

According to another aspect of the invention, there is provided a photoelectric device comprising at least one photoelectric structure configured as described above. The device may for example be comprised of at least two of such photoelectric structures accommodated in a spaced-apart relationship, and a reflector arrangement. The latter comprises a predetermined number of reflecting surfaces arranged such that the reflecting surface is accommodated in a space between each two locally adjacent photoelectric structures, and has a curved geometry to reflect the electromagnetic radiation incident thereon towards two light collection surfaces of the photoelectric structures, respectively, at opposite sides of said reflecting surface.

According to yet further aspect of the invention, there is provided a method of manufacturing the above-described photoelectric structure. The method comprises: providing an intrinsic semiconductor wafer of a certain thickness having substantially planar top and bottom surfaces; and forming multiple PiN cells from said intrinsic semiconductor wafer such that a ratio between a width of the intrinsic semiconductor region of the cell and a width of each of the p- and n-type regions is at least 1000.

According to some embodiments, the formation of the PiN cells comprises: applying a first cutting procedure to the intrinsic semiconductor wafer to create a substantially rectangular block of said certain thickness having the front and rear surfaces and side surfaces.

In some embodiments, the top and bottom surfaces of the semiconductor block serve for forming therefrom the front and rear surfaces of the PiN cells. The doping and Ohmic contacts creation procedures can be successively applied to the two opposite sides surfaces of said block. Either after the application of these procedures, or before it, said block is cut into plate like elements. Then, further cutting of the doped and metallized structure may be carried out to obtain a desired number of the PiN cells.

According to some other embodiments, the doping and Ohmic contacts creation procedures are applied to the top and bottom surfaces. Then, the intrinsic semiconductor block may be cut along at least one cutting surface, which intersects said top and bottom surfaces and said side surfaces, to create plate like elements, each presenting the PiN cell.

In yet further embodiments, the formation of the multiple PiN cells from said intrinsic semiconductor wafer comprises forming an integral structure of the multiple cells, being electrically connected with one another, while within the same intrinsic semiconductor wafer. This can be implemented by patterning the front or rear surface to create an array of spaced-apart grooves, the space between the grooves defining the width of the PiN cell; and successively applying doping and Ohmic contacts creation procedures to side surfaces of the grooves.

To form a multi-cell structure, the multiple cells may be made from the different intrinsic semiconductor wafers (e.g. each fabricated as described above) and assembled in an array to thereby enable conversion of a broad band spectrum of the electromagnetic radiation by the multiple cells together. The assembling may comprise mounting the multiple cells in spaced-apart relationship on a common substrate; or mounting the multiple cells in a stack one on top of the other, with thermo-conductive glue layers in between the cells. In the latter case, the glue layers and the arrangement of the cells in the stack are selected to provide a predetermined profile of a refractive index through the stack.

According to yet further aspect of the invention, there is provided a method of manufacturing the above-described photoelectric structure, utilizing formation of a thin film layer of the intrinsic semiconductor on a substrate. The thin film has a thickness selected in accordance with a thickness of the PiN cell. Then, doping and Ohmic contacts creation procedures are applied to side surfaces of the thin film, or to segments of the thin film (in case it was first divided into segments e.g. by patterning) to form one or more of the PiN cells.

In either one of the above embodiments, the doping procedure was carried out to provide the lateral electric field in the PiN cell of the order of $10^5$ V/cm. This may be achieved by selecting a dopant concentration of about $10^{19}$-$10^{21}$ cm$^{-3}$, or generally selecting the doping to provide degenerated level of concentration of a dopant.

It should be noted that the photoelectric structure of the present invention may be used with any light source whether natural sunlight or an artificial source and exploits the entire range of the spectrum of the light radiation.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 4B shows a vertical cell pixel, and FIG. 4C shows a vertical pixel example formed with an optical concentrator assembly;

FIG. 6 shows an intrinsic semiconductor ingot grown for preparation of the PiN cells, FIGS. 6A-6B show the top and side views of the semiconductor block prepared from the ingot of FIG. 5 (using a cutting technique); FIGS. 6C-6D show the top and side views of the block during a further cutting step, dividing the block into separate plates (using conventional cutting methods); FIG. 7 shows a further step of arranging the plates to form a block by using a temporary stick on a suitable substrate for providing simultaneous activation (doping) and metallization of opposite side surfaces of all the plates; and FIG. 8 shows how the plates are further arranged together to be cut into smaller slices each to form a PiN cell;

FIG. 9A illustrates a semiconductor (silicon) wafer W of a disc-like shape, e.g. prepared with a desired height in accordance with a width of the cell, FIGS. 9B and 9C illustrate respectively the side and front views of an arc-shaped PiN structure prepared from the wafer of FIG. 9A, and FIG. 9D shows a multi-cell curved PiN structures;

FIGS. 11A to 11E exemplify yet another technique of the fabrication of a photoelectric device of the present invention, suitable for the fabrication of multi-cell structure from the same intrinsic semiconductor wafer while eliminating the cutting procedure, where FIG. 11A shows the wafer etched into grooves from a top surface almost to the bottom of the wafer, FIG. 11B show more specifically the arrangement of grooves, FIG. 11C show how the side surfaces are treated to create p- and n-regions; and FIGS. 11D and 11E show the metallization step for creation of Ohmic contacts;

DETAILED DESCRIPTION OF THE PREFERRED EMBODIMENTS

Figure 1:
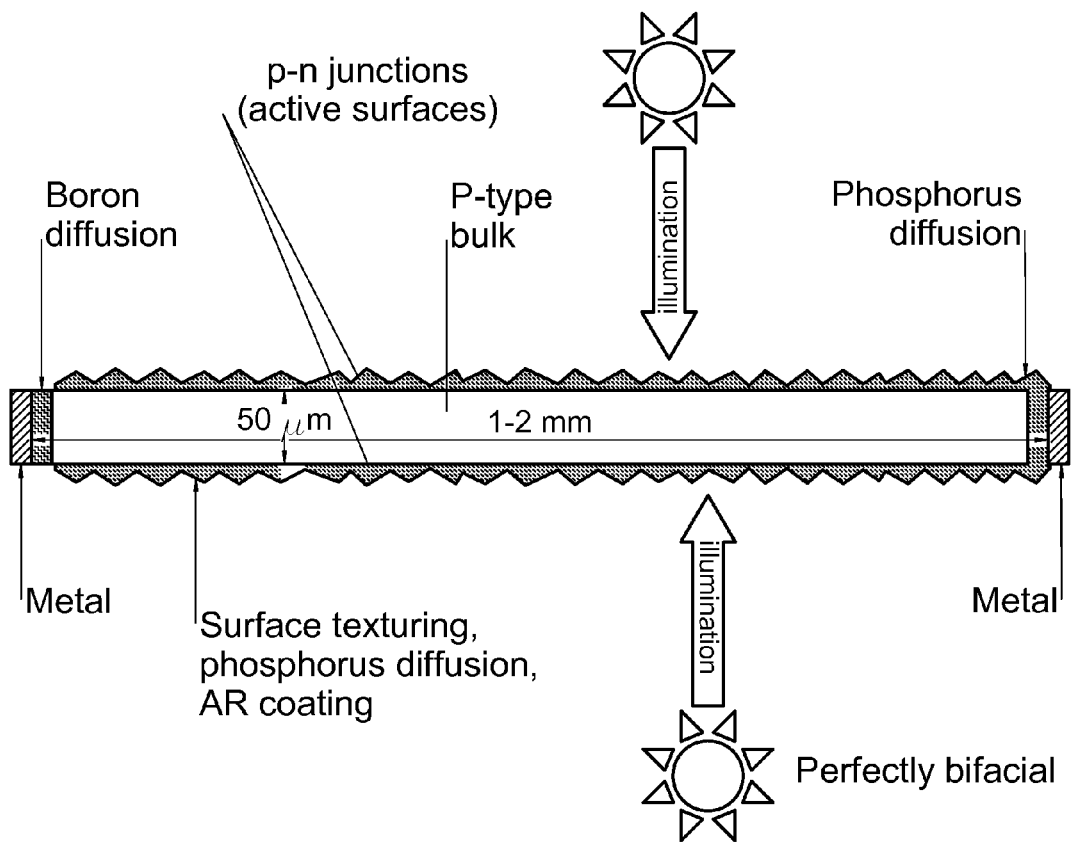
FIG. 1 shows a photovoltaic cell configured and operable according to the conventional approach, including p-n junctions as active regions.

FIG. 1 shows a photovoltaic cell configured and operable according to the conventional approach. In such cell, p-n junctions are used as active regions, i.e. light absorbing regions in which charge carriers are thus generated.

Figure 2A:
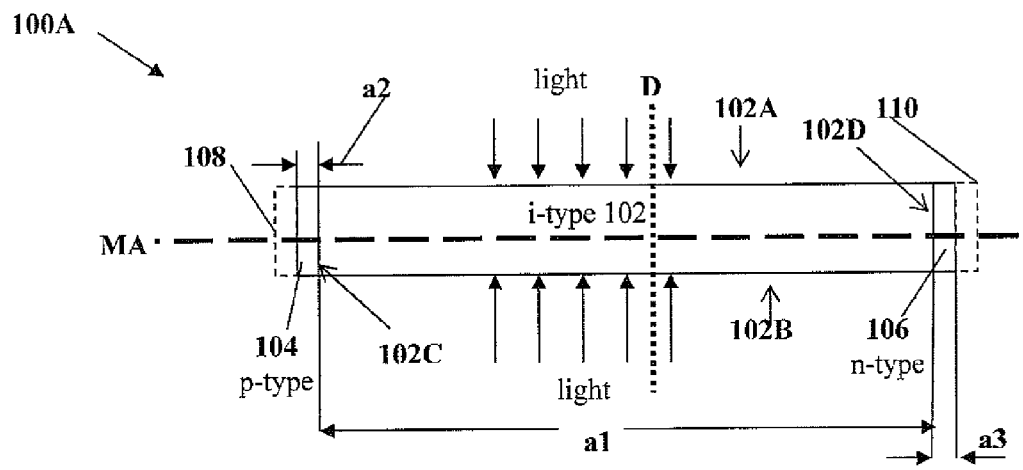
FIGS. 2A and 2B show cross-sectional views of photoelectric structures, which are configured in accordance with two examples respectively, of the general embodiment of the present invention.

Reference is made to FIG. 2A illustrating schematically a cross-sectional view of a photoelectric cell, which is configured according to the general embodiment of the present invention and can be used in a multi-cell photoelectric structure or constitute a single-cell photoelectric structure of the present invention. Thus, generally a photoelectric structure of the invention includes one or more photoelectric cells. In the present example the single-cell structure 100A is shown. The photoelectric cell is a PiN cell having an intrinsic (i.e. i-type) semiconductor bulk 102 which is an active region of the cell 100A, i.e. a region in which charge carriers are generated in response to the photon absorbance therein. The intrinsic semiconductor bulk 102 has front and rear surfaces 102A and 102B, which are both active surfaces and thus can both serve as light collection surfaces. The structure is configured so as to expose either one of these surfaces or both to incident light. As shown in the figure, in the present example, the structure 100A is configured for bi-facial light collection: both of the front and rear surfaces 102A and 102B are exposed to light and thus operate as radiation collection surfaces. When the structure 100 is put in operation, light collected by surface(s) 102A, 102B of the intrinsic semiconductor bulk can generally be described as having a general propagation direction/axis D.

The intrinsic semiconductor bulk 102 has side surfaces 102C and 102D on which p- and n-type conductivity regions 104 and 106 are provided extending along the respective side surfaces. These p- and n-type conductivity regions 104 and 106 serve for creating high electrical field to collect the excess charged carriers in the semiconductor bulk 102 in response to the collected electromagnetic radiation to which the at least one of active surfaces 102A and 102B is exposed during the PiN cell operation. Further provided are Ohmic contacts 108 and 110 to the p- and n-doped regions 104 and 106 for external contacts.

The intrinsic semiconductor bulk 102 being a crystalline structure has a major axis MA (preferably a single crystalline, 100-plane oriented semiconductor) presenting a direction of the highest mobility of the charge carriers in the crystal. The structure 100A is configured such that the major axis MA extends laterally between the P- and N-regions 104 and 106. The major axis MA is thus substantially parallel to the light collection surface 102A, 102B, (or substantially perpendicular to the general propagation direction D of light to which said intrinsic semiconductor bulk is exposed).

As indicated above, the semiconductor bulk is preferably a single-crystalline bulk, which may generally be a 110- or 111-plane crystal, but preferably is a (100)-plane crystal, and is oriented within the cell such that its major axis extends along the light collection surface and thus the directions of highest mobility of the charge carriers are in between the P- and N-regions.

According to the invention, the intrinsic semiconductor bulk 102 has a width $a_1$ which is much larger than the width $a_2$ or $a_3$ of the p- and n regions 104, 106 respectively. Preferably, a ratio $a_1/a_2$ or $a_1/a_3$ is at least 1000 (for example, $a_2=a_3=1$ μm and $a_1=1$-20 mm). The width of the intrinsic semiconductor bulk 102 may be up to 50 cm and said ratio may be enlarged up to 100000. Such a high ratio is possible for the cell operation because of the lateral mode operation used in the present invention, i.e. where the charge carriers mobility contributing into the cell output is that traverse to the light propagation direction. Moreover, such a high ratio is preferred in order to increase the efficiency of the cell operation as the high ratio provides for significant increase of the effective active region, namely the active region of the given cell involved in the conversion of electromagnetic radiation into the charge carriers. It should be understood that for a given P- and N-dopings, defining the internal electric field, the dimensions of the intrinsic semiconductor bulk defines the output power of the cell.

Figure 2B:
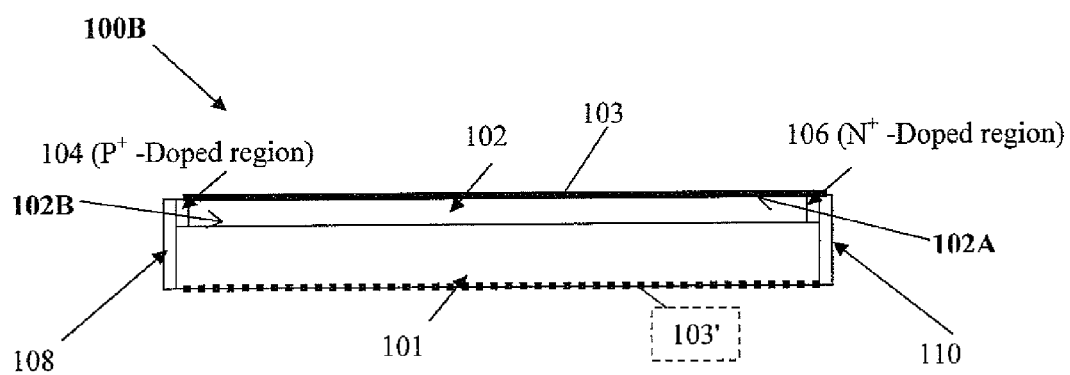

FIG. 2B shows another example of a general configuration of a photoelectric structure of the invention. To facilitate understanding, the same reference numbers are used for identifying components that are common in all the example of the invention. Here, a photoelectric structure 100B differs from the above-described example of FIG. 2A in that it includes one or more PiN cells (one such cell being shown in the figure) in the form of a thin film located on a substrate 101. In the present example, intrinsic silicon thin film 102 is located on $SiO_2$ or $Al_2O_3$ substrate. According to some embodiments transparent substrate is used allowing operating the thin film PiN cell in a bi-facial light collection mode (i.e. converting to electricity light impinging on both the front and rear surfaces of the cell 102A and 102B). In this case, antireflection coatings 103 and 103' can optionally be applied to the front light collection surface 102A and to the substrate 101, respectively, to improve the cell's light collection efficiency.

This structure may be produced by any suitable thin film technology, e.g. using SOI (Silicon On Insulator) technology. Generally, thin silicon layer 102, e.g. single-crystal behavior layer, e.g. of a thickness from about a few microns to about 1 mm, may be grown on top of insulating glass substrate ($SiO_2$) 101 of any thickness; or may be deposited onto the substrate, either by chemical methods such as plasma techniques, or physical methods such as sputtering or molecular beam epitaxy (MBE).

As indicated above, the silicon thin film layer is preferably the single-crystal layer. Such layer may be manufactured for any suitable technique, for example by using the recently developed "dry transfer printing technique". This technique is described for example in "*Bendable single crystal silicon thin film transistors formed by printing on plastic substrates*", E. Menard et al., Applied Physics Letters 86, pages 093507-1-093507-3. This publication is incorporated herein by reference with respect to a specific possible example of the manufacture of cell of the present invention. This technique also enables a desired flexibility/bending property of the PiN cell.

As further shown in FIG. 2B (which is relevant for all other examples as well), the intrinsic semiconductor region (e.g. thin film layer) 102 may be provided with an antireflection coating 103 on its top side, in order to improve the cell efficiency. Also, common for all the example, heavily doped regions (p+ and n+) 104 and 106 with concentration of about $10^{19}$-$10^{21}$ atoms/$cm^3$ can be made on the side surfaces in several techniques, for instance by ion implantation or by diffusion. Metallization can be done by sputtering of metal substance on the heavily doped surfaces.

Figure 2C:
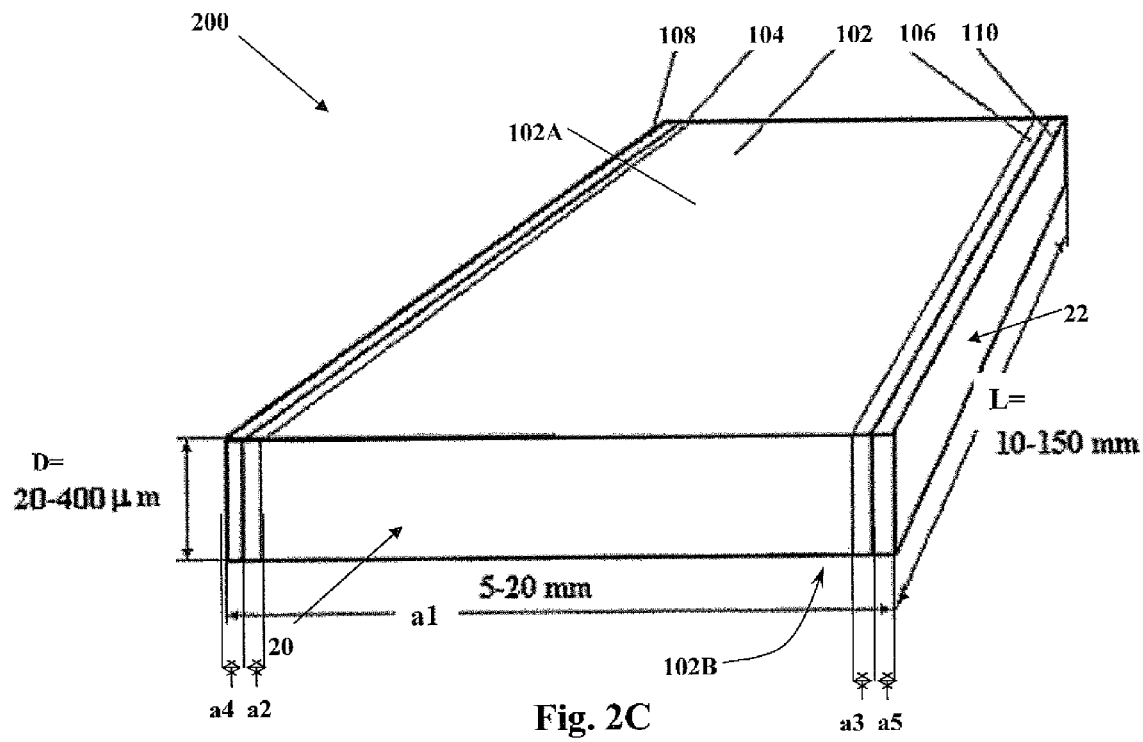
FIG. 2C shows a perspective view of the single-cell photoelectric structure generally similar to that of FIG. 2A.

FIG. 2C represents a schematic perspective view of a photoelectric cell 100C configured generally similar to that of FIG. 2A. As shown in this specific but not limiting example, PiN cell 100C may have a rectangular shape of about 20-400 μm thickness, about 5-20 mm width, and about 10-150 mm length. It should be noted that in this example, the photoelectric structure/cell has a planar shape, in particular a rectangular shape, the photoelectric cell of the present invention can be shaped to various non-planar contours, as will be detailed below. The cell 100C is formed by an intrinsic, preferably single-crystalline, semiconductor bulk 102 having front and rear surfaces 102A and 102B, and side surfaces 102C and 102D, and comprises P- and N-doped regions 104 and 106 at the side surfaces. Ohmic contacts 108, 110 are provided at the P- and N-doped regions 104 and 106. The width of the cell is formed by a width $a_1$ of the intrinsic semiconductor bulk and a width $a_2$ and $a_3$ of the P- and N-doped regions 104 and 106, as well as that of the Ohmic contacts 108, 110. The width $a_2$, $a_3$ of the doped region 104, 106 (as well as that of the metallic contact) is a few microns As shown in FIGS. 2A to 2C, the PiN cell of the present invention is configured such that the widest (and thus the largest) surface of the cell is the radiation collection surface 102A, 102B of the intrinsic semiconductor bulk 102. The thickness of the cell is appropriately selected in accordance with a wavelength range to be converted by the cell into the electrical output.

It should be noted here that a PiN cell of the present invention might be configured for efficiently converting electromagnetic radiation of various wavelengths (or wavelength bends) into electric energy. Accordingly, a PiN cell of the present invention can be fabricated utilizing various semiconductor materials such as Germanium (Ge), Silicon (Si) and Gallium-Arsenide (GaAs) which have different energy band gaps and which are thus suited for absorbance and conversion of electromagnetic radiation of different wavelengths respectively. As is further described below with reference to FIGS. 4A-4C, the invention allows for combining multiple PiN cells of different semiconductor materials to thereby provide a photoelectric structure capable of converting broad spectral range of electromagnetic radiation into electricity.

Figure 2D:
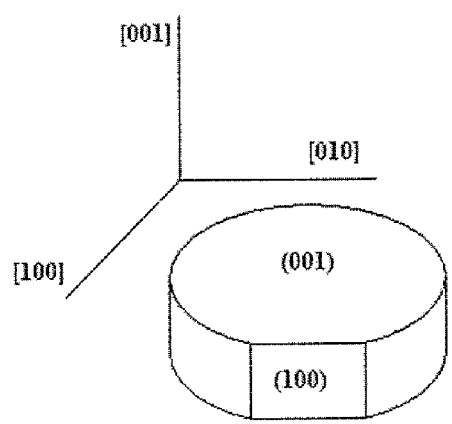
FIG. 2D represents crystallographic planes of a crystal piece (ingot) which can be used for the preparation therefrom of an intrinsic single-crystalline semiconductor bulk to be used in the photoelectric structure of the present invention.

It indicated above, the semiconductor bulk is preferably a single-crystalline structure. The use of single-crystalline materials is preferable due to its higher quantum efficiency. In the above examples, the intrinsic semiconductor bulk 102 is a single-crystal piece (e.g. prepared (cut) or grown on a substrate) such that the front/rear surfaces 102A, 102B being the largest surfaces of the cell 200 are orientated along the (100) plane, and accordingly the side surfaces 102C and 102D are is orientated along the (001) plane, and another side surface 105 is orientated along the (010) plane. FIG. 2D represents crystallographic planes of a crystal piece (ingot) which can be used for the preparation therefrom of an intrinsic single-crystalline semiconductor bulk.

Ohmic contacts 108, 110 serve to connect the photoelectric cell to other semiconductor cells or to connect it to output terminals. These Ohmic contacts may be made as metal layer coatings on the two opposite doped regions 104 and 106. More specifically, metal coatings 108 and 110 are selected with appropriate work function as compared to that of the semiconductor such as to enable Ohmic contacts to the p- and n-regions, and are for example Ni and In.

Figure 2E:
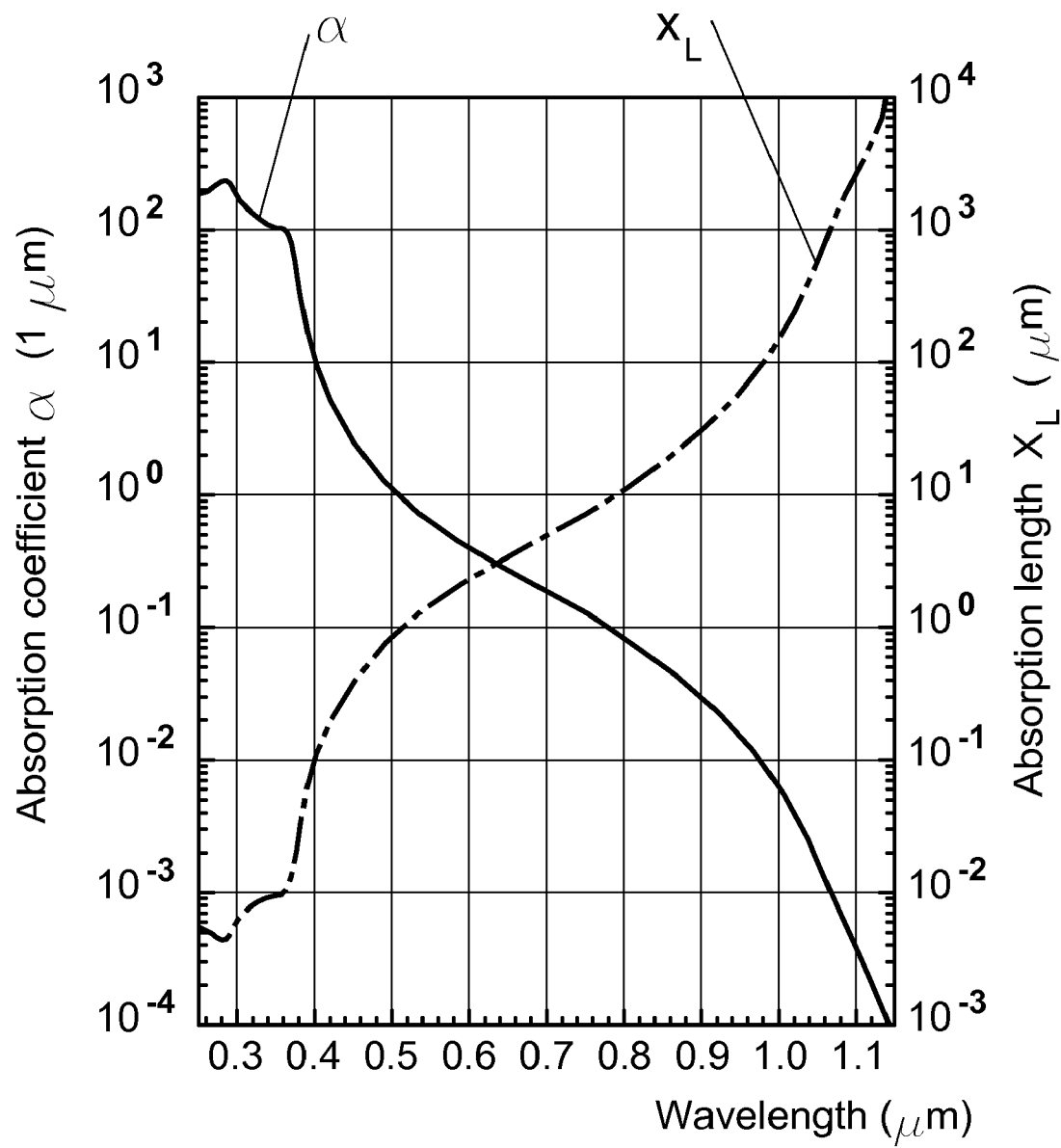
FIG. 2E illustrates the principles of selection of the PiN cell thickness, showing the absorption coefficient and absorption length as functions of wavelength of light incident onto the cell.

As mentioned above, the thickness of the cell is appropriately selected in accordance with a wavelength range to be converted by the cell into the electrical output. In this connection, reference is made to FIG. 2E illustrating the principles of selection of the cell thickness, taking into account dependence of the absorption coefficient and absorption length (penetration depth of photons) on the wavelength of incident radiation for a semiconductor bulk (silicon in the present example). Two graphs $\alpha$ and $X_L$ are shown in the figure corresponding respectively to the absorption coefficient and absorption length functions. As shown in the figure, the absorption coefficient, and therefore the penetration depth of photons into the silicon bulk, depends on the wavelength of the radiation. As will be described below, in some applications of the invention, where intrinsic silicon is used for conversion of a wavelength range of about 0.87 to 1.1 μm, the effective silicon thickness may be selected accordingly in the range of about 15-400 μm.

It should be noted that the photoelectric structure of the present invention, utilizing intrinsic semiconductor as the active region of the photoelectric cell, advantageously eliminates or at least significantly reduces a temperature dependence of the efficiency of the cell operation. In this connection, it should be understood that with the convention approach such temperature dependence of the conversion efficiency of the structure is undesirably high. More specifically, the specific electrical conductivity of a semiconductor varies with the temperature due to the dependence of free charge carriers' concentration on the temperature. This dependence occurs for all temperatures: at low temperatures when not all the impurity atoms are ionized, at room temperature, and at high temperatures when the rate of generation of thermally created free carriers increases.

For any semiconductor, the minority and majority carriers' density is related to the intrinsic concentration $n_i$ by the following expression:

$$np = n_i^2$$

where $n_i$ reflects an intrinsic concentration of charge carriers defined by the environmental temperature, a bandgap width and an effective mass of the charge carriers. This relation is associated with the charge conservation law, and it describes equilibrium between the generation rate (as a result of thermal energy only, manifested by vibrational waves in the crystal lattice (i.e. phonons)) and the recombination rate. Both the generation and the recombination processes are highly dependent on the temperature conditions of the semiconductor. Thus, $n_i$ is a very sensitive function of such parameters as temperature T and energy bandgap Eg (which is also slightly dependent on T), as follows:

$$(n_i)^2 \sim T^3 \cdot \exp(-E_g/K_B T)$$

The temperature dependence of $n_i$ arises mostly from the exponential term. In this connection, it should be understood that when operating with the conventional P-N junction based photoelectric device, the increase in temperature results in a dramatic increase in the free carriers' concentration, thus actually "blurring" an interface between P- and N-doped layers, practically canceling the P-N junction effect, thus reducing the local electric field of the junction (at the depletion region), thus impeding charge collection therefrom. Additionally, the increase of free carriers' concentration increases the probability of their recombination. On the contrary, in the present invention, where an intrinsic semiconductor bulk is used as the active region of the cell, an increase in the charge carriers concentration in the active region, e.g. due to the temperature condition or any other energy source, provides additional electron-hole pairs collectable by the electrodes, thus increasing the efficiency of the cell.

Figure 3:
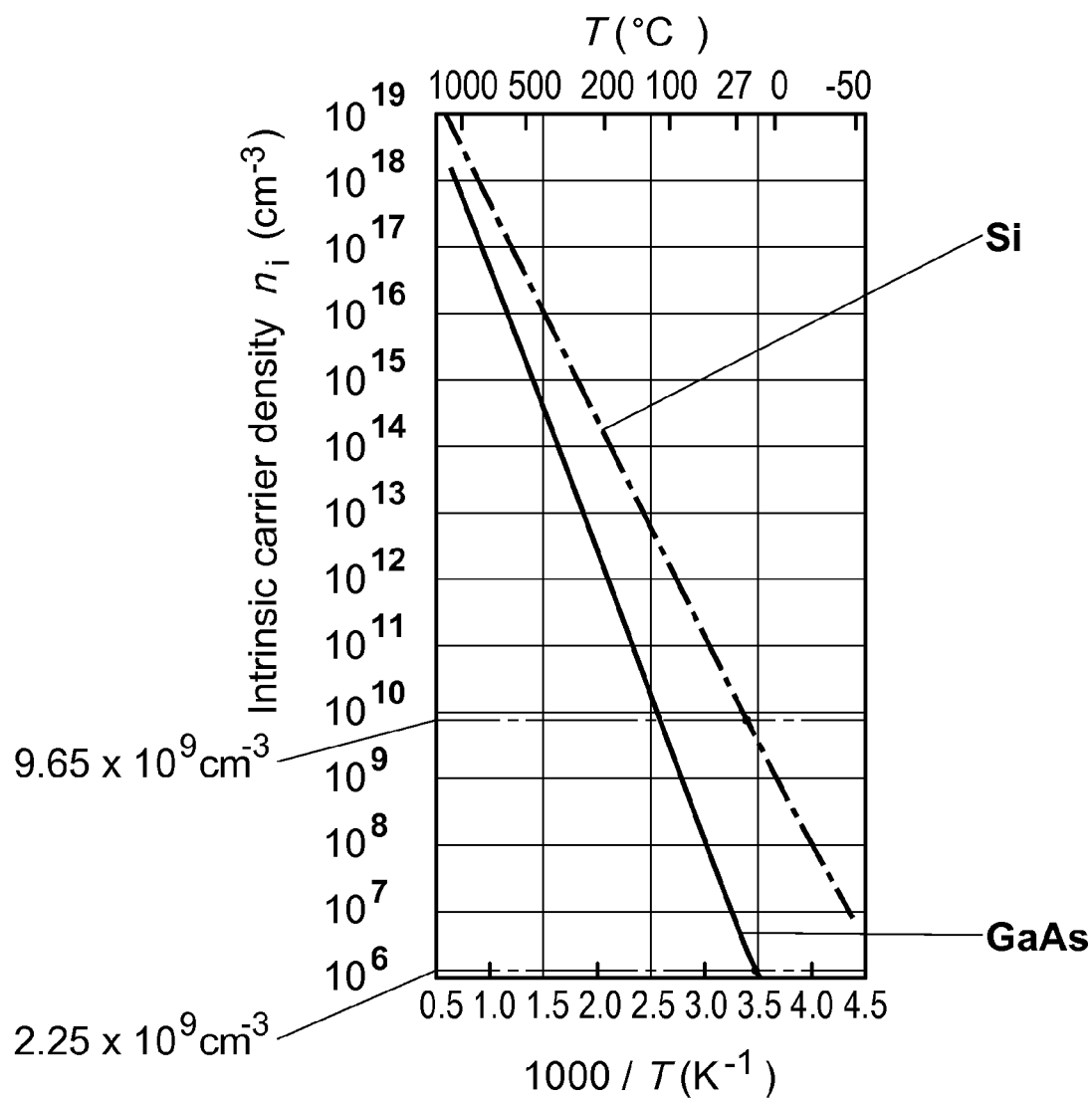
FIG. 3 shows a relationship between the intrinsic carrier density $n_i$ and the temperature, for an intrinsic silicon and intrinsic GaAs.

In this connection, reference is made to FIG. 3 illustrating a relationship between the intrinsic carrier density $n_i$ and the temperature, for an intrinsic silicon and intrinsic GaAs. As shown, at high temperatures (600° C. and above) the equilibrium free charge carriers concentration is high, being at the order of $10^{17}$ cm$^{-3}$, due to the phonon interactions occurring at such high temperatures. Sunlight provides similar level of charge carriers' concentration. The PiN cell of the present invention is capable of generating power when the intrinsic carrier density increases due to photon absorption or phonon vibration (due to increasing temperature). This carrier density can be obtained either by exposing the device to light in a specific wavelength range (to obtain a photon interaction) or by elevating the device temperature to a higher temperature, for example: above 600° C. The photoelectric structure can therefore be used in a thermal excitation mode (e.g. phononic interaction mode, by elevating the charged carrier density by heating, or in a photonic/photovoltaic excitation mode.

As indicated above, the photoelectric structure may include multiple PiN cells. For example, in order to provide conversion of broadband electromagnetic radiation into electrical energy, and thus increase the efficiency of the entire photoelectric structure, the multiple cells include intrinsic semiconductor bulks made of different semiconductor materials. The cells may have the same shape or not. In this case, the different semiconductor materials are selected to absorb complementary spectral bands of the radiation to be converted/detected (typically, solar radiation). The resulting output power of the photoelectric structure is thus described by the sum of the outputs of the multiple PiN cells.

Figure 4A:
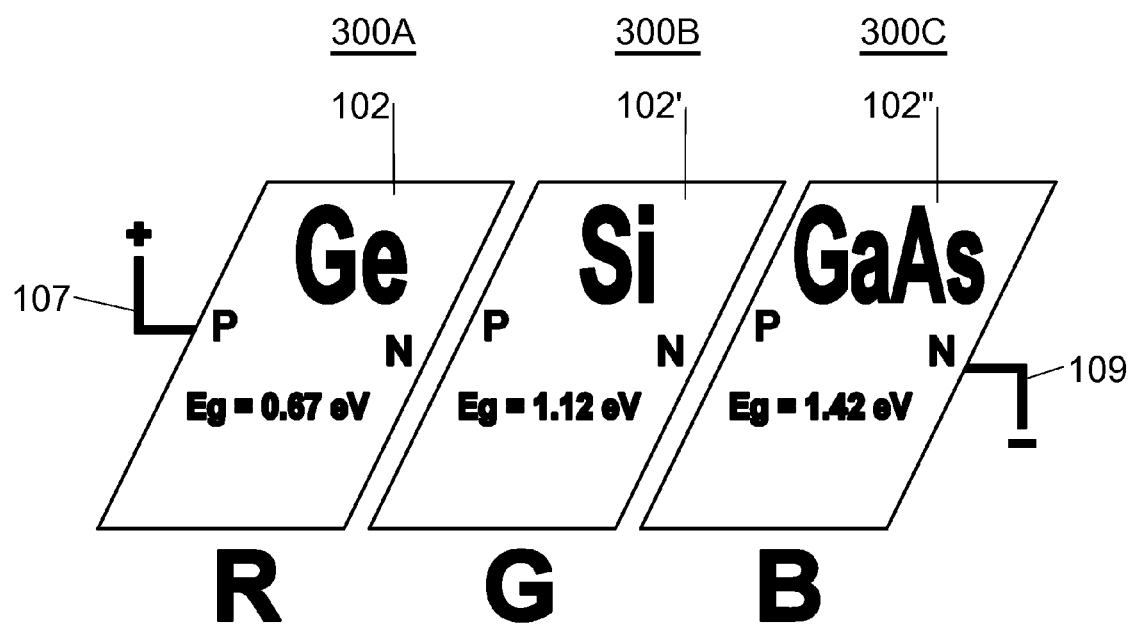
FIGS. 4A to 4C illustrate three different example respectively of a multi-cell configuration of the photoelectric structure of the present invention, where FIG. 4A exemplifies a lateral arrangement of the multiple cells (sub-pixels)

FIG. 4A exemplifies the principles of the above multi-cell concept. The figure illustrates three PiN cells 300A, 300B and 300C arranged in a multi-color structure, e.g. a single RGB pixel-configuration. The PiN cells have intrinsic semiconductor bulks 102, 102' and 102" each formed on its side surfaces with P- and N-doped regions defined by impurity type associated, and relatively positive and negative Ohmic contacts (not specifically shown), which are connected, via electrical wires, generally at 107 and 109, to respective terminals of a read-out circuit. Such multi-cell (pixel) structures may be arranged in a power source system (solar battery) of a required output voltage and power, or in a photodetector system. Each PiN cell (its intrinsic semiconductor bulk) absorbs a different part of radiation spectrum (e.g. solar spectrum). In this connection, it should be understood that as the multi-cell configuration results in the absorbance of the broadband part of the incident radiation, less amount of incident radiation is left for conversion to heat, thus decreasing the work temperature of the structure, under given ambient temperature condition.

In this example, the semiconductor bulks 102, 102' and 102" are made of intrinsic Ge, Si and GaAs respectively for absorbing different spectra, designated here R, G, B to identify absorption of relatively long, middle and short wavelengths. It should be understood that this designation should not be confused with the primary colors and respective frequency ranges frequently used in the literature. It should also be noted that the present invention is limited neither to any specific number of PiN cells in the structure, nor to any specific intrinsic semiconductors/absorption spectra to be converted. Thus, here, the absorption spectra of the so-called R-, G-, and B-cells are about 1.1-1.8 μm (Germanium), about 0.87-1.1 μm (Silicon) and about 0.4-0.87 μm (Gallium arsenide), thus covering together the IR-UV spectral range.

Figure 4B:
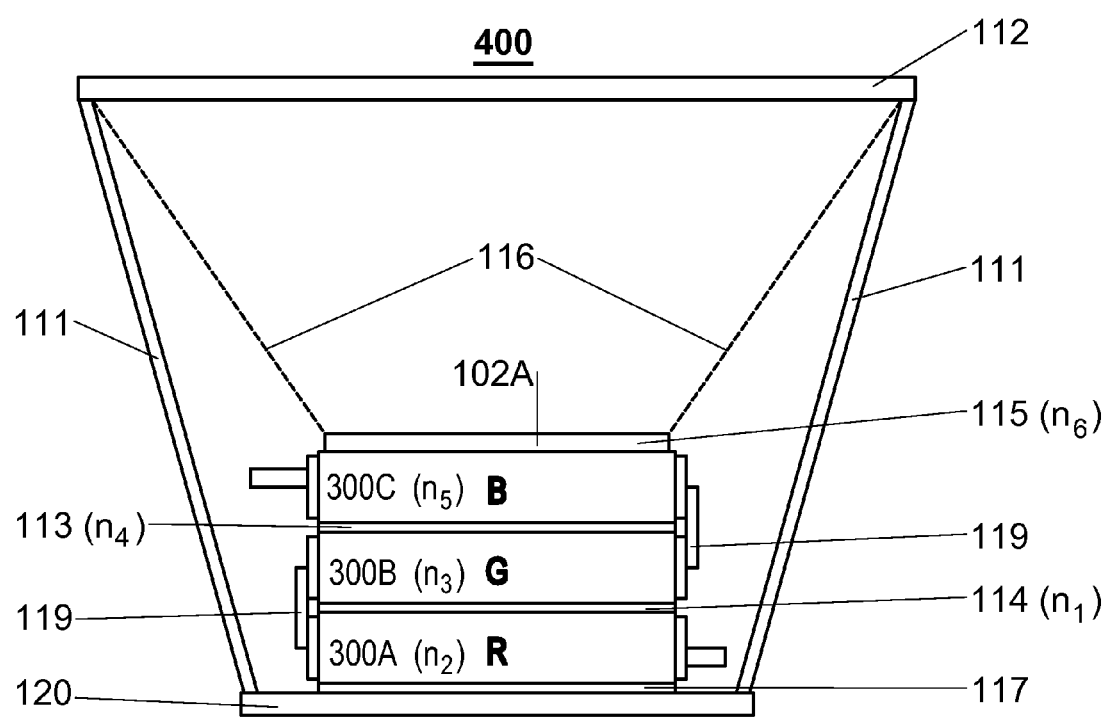
Figure 4C:
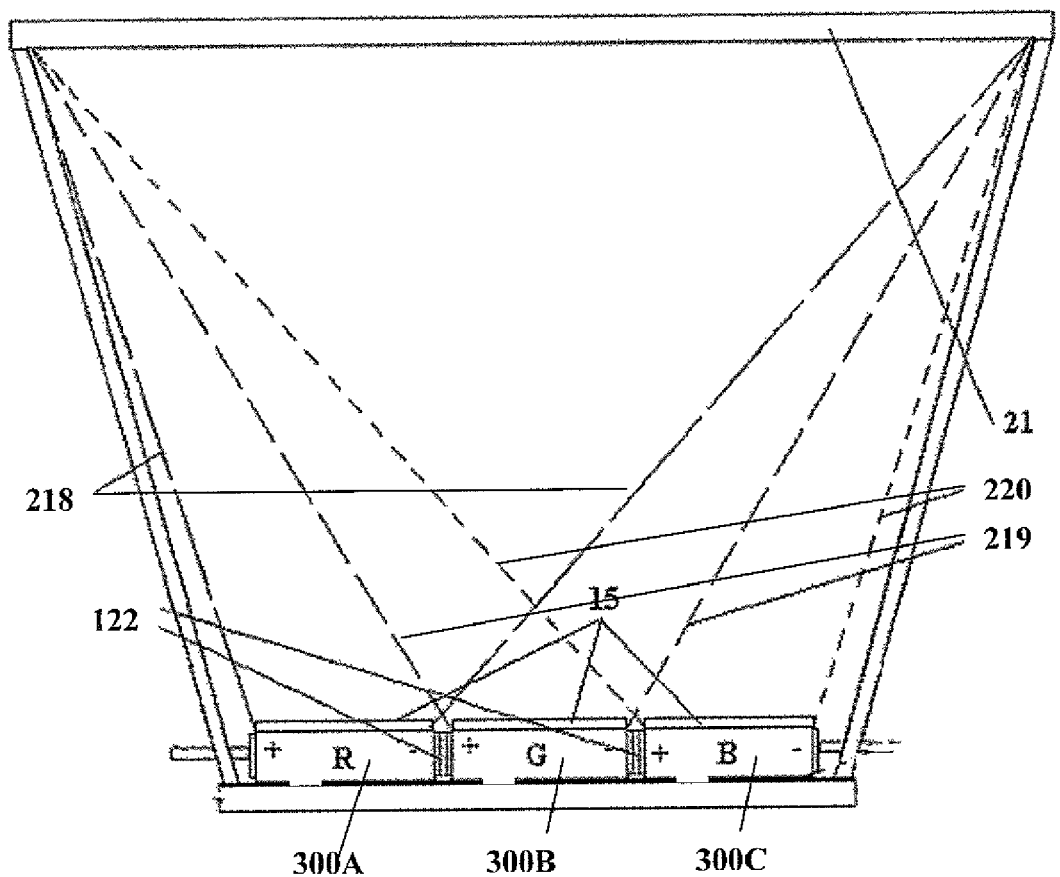

Reference is made to FIGS. 4B and 4C showing two specific, not limiting examples, respectively of a multi-cell structure.

In the example of FIG. 4B, a photoelectric structure, generally designated 400, Includes three PiN cells 300A, 300B and 300C (being R-, G- and B-cells as explained above) which are arranged in a stack configuration such that the structure is exposed to incident light by the front surface of the uppermost cell 300C in the stack. Preferably, the arrangement of the cells from the uppermost to the lowermost one (i.e. in the general light collection/propagation direction) is such as to provide a successive, from cell-to-cell, increase of the absorbance wavelength. This is associated with the penetration depth of different wavelengths, and also with the fact that a semiconductor material intended for absorbing longer wavelengths is also capable of absorbing shorter wavelengths of higher energies, while only a part of this energy is converted into electrical energy while the remaining part causes heating of the respective cell.

More specifically, the upper B-cell has intrinsic GaAs bulk having the highest bandgap, and absorbing photons having energy higher than the bandgap of the G-cell, which utilizes intrinsic Si having a lower band gap than that of GaAs. This, G-cell absorbs photons having energy higher than its bandgap and lower than the bandgap of GaAs. The third, R-cell includes intrinsic Ge bulk of even lower bandgap absorbing photons having energy lower than of the G-cell.

In some embodiments, the multi-cell structure is supported on a thermo-conductive substrate, for example by gluing it to the substrate using a thermo-conductive glue. In the example of FIG. 4B, the lower R-cell is glued on a thermo-conductive substrate 120 using thermo-conductive glue 117. The G-cell is mounted on the R-cell, and B-cell is mounted on the G-cell using glue layers 114 and 113, which are preferably thermo-conductive. The glue materials are selected such as to provide a predetermined profile of the refractive index through the structure corresponding to a decrease of the refractive index of the intrinsic semiconductors (and glue layers in between) from the uppermost to the lowermost semiconductor bulk (in the general light propagation direction). More specifically, glue layer 114 has a refraction index $n_1$ lower than a refraction index $n_2$ of the intrinsic semiconductor (Ge) below it and higher than refractive index $n_3$ of the intrinsic semiconductor (Si) above it; and similarly glue layer 113 has a refractive index $n_4$ satisfying the condition $n_3 > n_4 > n_5$, where $n_5$ is the refractive index of GaAs. In general, in order to increase light absorbance the first (uppermost) layer is selected with the smallest refraction index and the rest of successive layers towards the lowermost one must have higher refraction indices. Thus, the upper GaAs layers may be coated with a glass ($SiO_2$) layer to serve as antireflection coating.

Also, in the present example, the PiN cells in the stack are electrically connected in series, e.g. using metal bridges 119 preferably prepared from indium. To decrease radiation reflection from the upper surface of the RGB-pixel structure 400 (i.e. light collection surface 102A of the upper B-cell 300C), this surface may be coated with an antireflection coating 115. Such antireflection coating 115 is made of a material composition having a refractive index $n_6$ substantially equal to the square root of the refractive index $n_5$ of the intrinsic semiconductor (GaAs) of the uppermost B-cell.

To facilitate a required concentration of the radiation collected by the photoelectric structure, an appropriate optical system can be used, for example including one or more Fresnel lens 112. The latter may be mounted above the structure 400 using spacers 111.

In the example of FIG. 4C, a photoelectric structure 500 includes three PiN cells 300A, 300B and 300C configured similar to the above described R-, G- and B-cells, but arranged here in a planar fashion, namely in a spaced-apart relationship in a common plane perpendicular to the general light collection/propagation direction. In the present not limiting example, the PiN cells are electrically connected in series, e.g. using metal bridges 122 built for example from indium. The three PiN cells are exposed to radiation with a certain limited field of view defined by the effective aperture of the structure (associated with the dimensions of the structure), and each of the cells (the respective intrinsic semiconductor bulk) is intended for conversion of a different part of the spectrum to which the structure is exposed. Consequently, in order to effectively utilize the incident radiation and to prevent the energetic photons coming upon one of the cells and being outside its intended spectrum from heating said cell, an appropriate spectral splitting optics (e.g. diffraction optics) is used. Such optics may include a Fresnel splitter-concentrator 21, which spatially separates and directs different spectral portions of the radiation incident thereon along different paths to propagate towards the corresponding cells: low-energetic flux 218, middle-energetic flux 219, and high-energetic flux 220. By this way, the undesirable heating is prevented or at least significantly reduced, as described above, while not affecting the amount of collected radiation, and accordingly work temperature of the structure is decreased, increasing quantum efficiency of the structure.

In view of the above, the photoelectric structure of the present invention may be used as an optical sensor in the IR to UV spectrum (0.4-1.8 µm). The sensor can be used in a wide range of the optical spectrum, based on the cell base raw material. Germanium based sensor can be used in the (R) optical spectrum (0.8-1.8 µm), Silicon can be used for (G) optical spectrum (0.4-0.8 µm) spectrum and Gallium Arsenide can be used for (B) optical spectrum (0.4-0.2 µm) type sensor.

Figure 5:
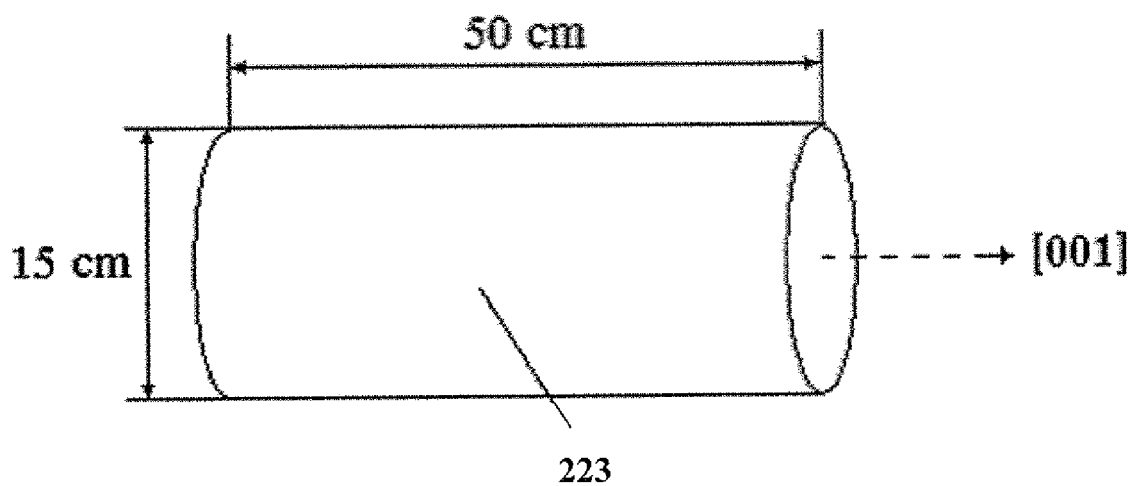
FIGS. 5, 6A-6D, 7 and 8 exemplify a method of fabrication of the photoelectric structure of the present invention, where

The inventors have conducted experiments with experimental PiN samples utilizing intrinsic silicon wafers of the 300 µm and 1.2 mm thicknesses and variable widths. Although the samples were prepared by "compensation" doping of the commercially available p-type wafer using donors particles in order to obtain substantially pure intrinsic semiconductor bulk, and although metallization at the p- and n-regions was not perfect (having defects resulting in some discontinuity of the metal regions), the experiments have proven that the PiN cells of the present invention are capable of generating electrical power, namely when the samples were exposed to light electrical output was detected, while under dark conditions, the power of the PiN cells decreased to zero The following are some examples of a manufacturing process suitable to be used for the manufacture of a photoelectric structure of the present invention. FIG. 5 shows an intrinsic semiconductor ingot 223 used a raw material for the preparation of a PiN cell. The ingot 223 can be grown by any conventional technique without addition of impurities, for example using Czochralski, Float Zone (Fz) or Bridgman puling technique. Preferably, the so-obtained ingot 223 is oriented in the [001] direction, as shown in the figure. The semiconductor ingot 223 has a cylindrical-like shape with a length of about 50 and diameter of about 15 cm.

Figures 6A, 6B:
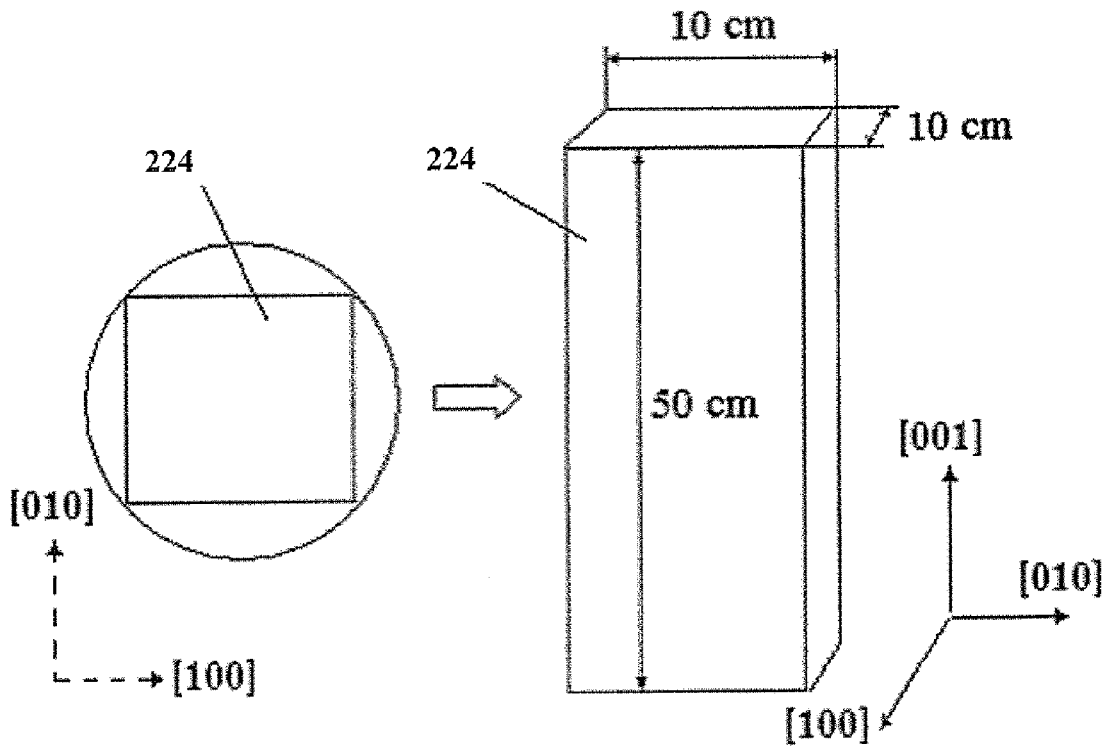

FIGS. 6A-6B show the top and side views of a semiconductor block 224 prepared from the ingot 223 of FIG. 5, using any suitable conventional cutting technique such as saw associated techniques or laser cutting techniques. The block 224 has dimensions of about 50*10*10 cm, and is properly oriented with directions [010] and [100], as shown in the figure.

Figures 6C, 6D:
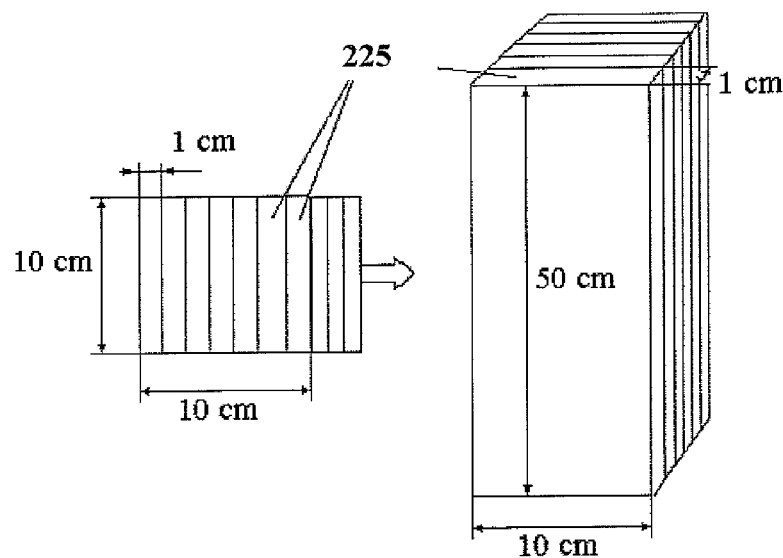

FIGS. 6C-6D show the top and side views of the 224 during a further cutting step, being divided into separate plates 225, using conventional cutting methods, such as saw associated techniques. Plates 225 have dimensions of about 50*10*1 cm and are highly oriented.

Figure 7:
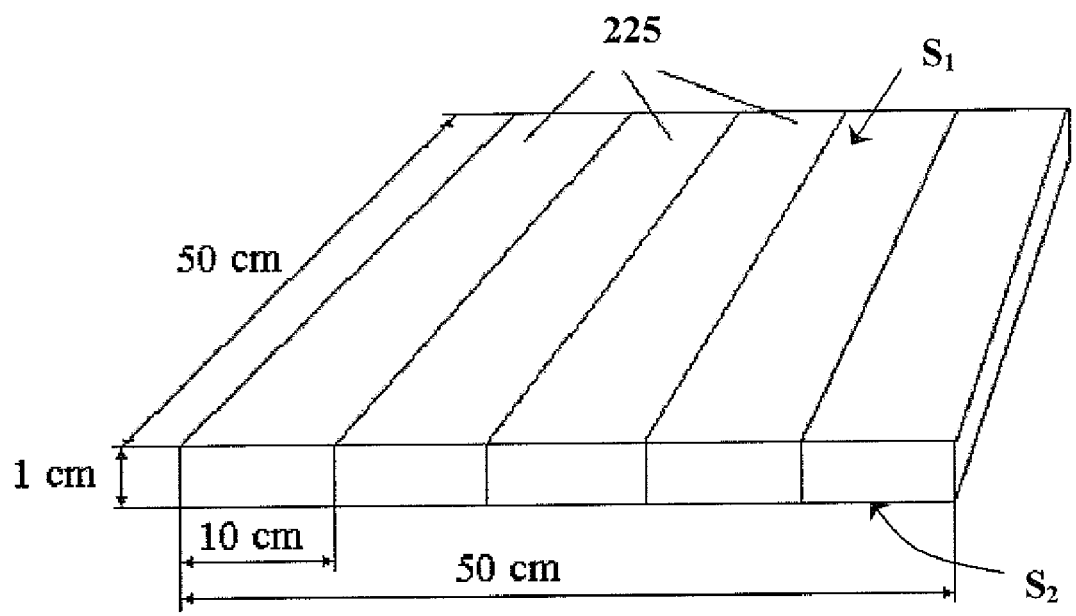
Figure 8:
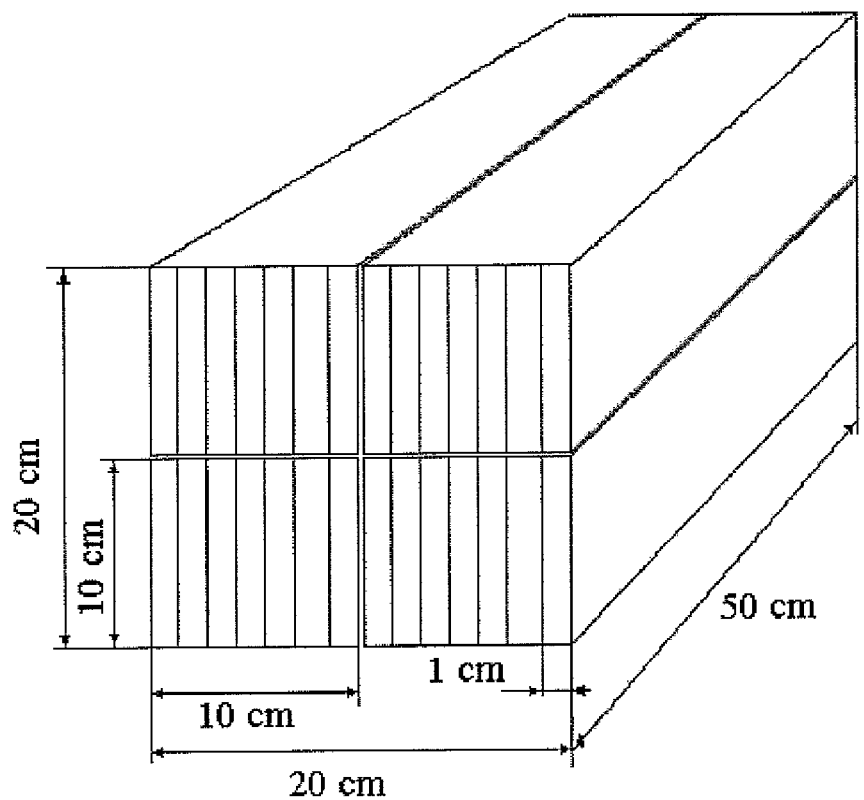

As further shown in FIG. 7, the plates 225 are then arranged to form a block by using a temporary stick on a suitable substrate (not shown) for providing simultaneous activation (doping) and metallization of opposite surfaces $S_1$ and $S_2$ of all the plates. One of these surfaces is activated to create a p-type region by for example diffusion or ion implantation of a material creating acceptor centers in the semiconductor, for example Boron for silicon, and the other surface is activated to create n-type region by diffusion of a material creating donor centers in the semiconductor, Arsenic or Phosphorus for silicon. Thereafter, a metal coating (e.g. Ni) is applied creating Ohmic-type of contact with the grown p-type region, and a suitable metal for the n-type region. After metallization, plates 225, each having dimensions of about 1*10*50 cm, are appropriately arranged for further cutting into smaller slices of 10 cm length, 1 cm width (in between the doped regions), and a desired thickness (selected as described above). This arrangement before cutting is shown in FIG. 8. In the present example, each PiN cell has dimensions of about 0.03*1*10 cm. The cutting procedure at this stage may also be carried out using any suitable conventional technique, for example a diamond wire. It should be understood that preferably, during the final production stage, the crystal piece is cut parallel to the crystal (1,0,0)-plane, forming a cut section of a parallelogram quadrangular shape. Each such PiN cell may be mounted to form an RGB pixel configuration as described above with reference to FIGS. 4A-4C, as also will be described below.

Figure 9A:
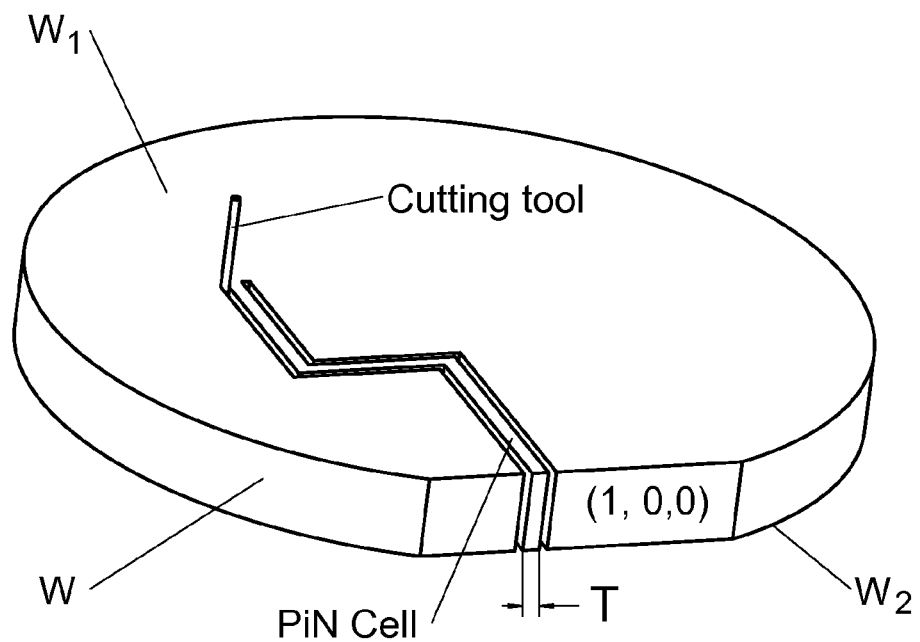
FIGS. 9A to 9D show another example of manufacturing the photoelectric structure of the present invention, where

Reference is made to FIG. 9A illustrating another technique of the manufacture of an PiN structure of the invention starting from a semiconductor (for example silicon) wafer W which has a disc-like shape, preferably previously prepared with a desired height in accordance with a width of cell (the intrinsic active region and the doped side regions). The disc thickness (height) can be from 1 mm up to 20 mm. Planar surfaces $W_1$ and $W_2$ of the wafer are appropriately p- and n-type doped and optionally also metallized prior to cutting the wafer into multiple slices of desired thickness(es) to form multiple PiN structures. The shape of the cell can be arbitrarily designed, preferably such that the solar cell major axis (highest mobility) is directed parallel to the silicon crystal direction (1,0,0). As noted above, the thickness of the slice can vary in the range of 20-400 μm (see also FIG. 2B). A suitable cutting tool may be a milling tool coated with a diamond powder, or a cutting disc, a laser beam or wire saw.

Figure 9B:
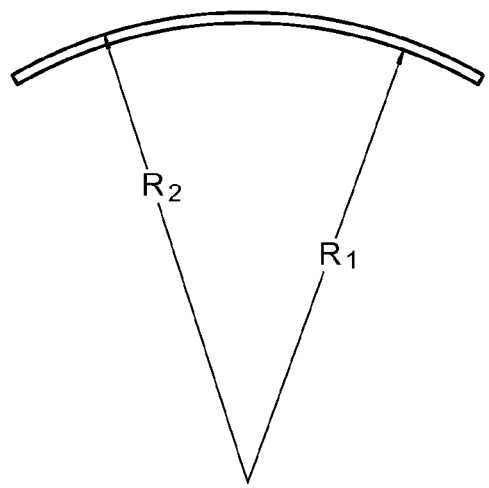
Figure 9C:
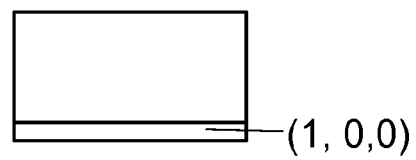
Figure 9D:
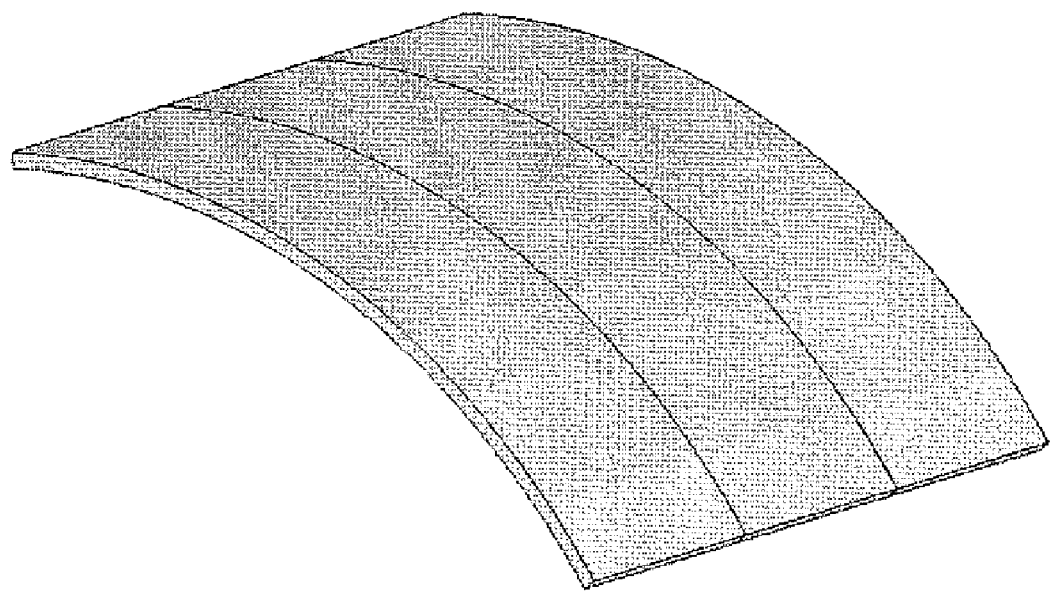

The above technique allows the manufacture of a PiN structure of the present invention with a predetermined shape to match that of a certain object on which the PiN structure is to be mounted. For example, as shown in FIGS. 9B and 9C, illustrating respectively the side and front views of the cell, such an arc-shaped PiN structure can be prepared from a disc-like wafer by the above-described technique. The arc radii R1 and R2 can vary in a range between 1 mm up to 500 mm depending on the silicon ingot dimensions. The section radii are dependable dimensions since the cross sectional dimension (thickness) can vary in a range of about 20-400 μm. As shown in a self-explanatory manner in FIG. 9D, multiple curved PiN structures may be assembled together and appropriately electrically connected (in series) through their metallized doped side surfaces to form a solar panel. Such panel can match the shape of an electric plane wing and/or fuselage.

As described above, the PiN structure of the present invention can be used as an optical sensor in the wavelength between from 0.4 to 1.8 μm depending on the semiconductor material(s) used. Incident radiation can be split (using a specific splitting and concentrating optical system) in multiple (e.g. three) spectral regions, e.g. (R) photons with wavelength from 1.1 to 1.8 μm, (G) photons with wavelength from 0.87 to 1.1 μm, and (B) photons with wavelength from 0.4 to 0.87 μm, associated with respectively intrinsic germanium, silicon element, and gallium arsenide semiconductor bulks, thus each one of the three PiN cells converts a suitable part of the solar spectrum.

Figures 10A, 10B, 10C:
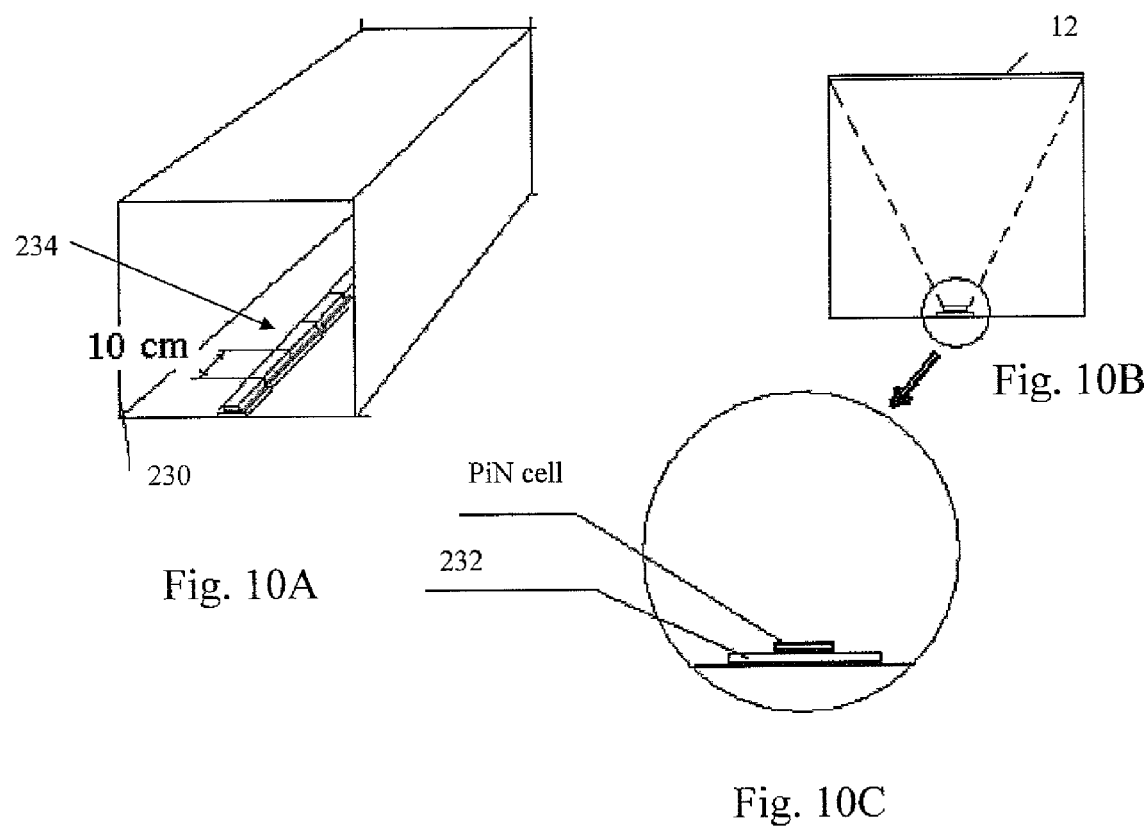
FIGS. 10A to 10C show a photoelectric structure (solar panel) according to an embodiment of the present invention, where the structure formed by an array of PiN cells is mounted inside an optical concentrator structure.

FIGS. 10A-10C exemplify a solar panel according to the embodiment of the present invention. Here, a structure formed by an array of PiN cells, generally at 234, is mounted inside a concentrator structure 230, which is in the form of a metal frame of appropriate dimensions, as shown in the figure. At the top side of the structure, a concentrating lens 12 (e.g. Fresnel lens) is mounted, defining the field of view of the so-obtained solar panel. As more specifically shown in FIGS. 10B and 10C, the array of PiN cells 234 is located on an aluminum support 232, e.g. serving for heat dissipation from the PiN cells.

The following is another suitable method for the manufacture of a multi-cell PiN structure using a semiconductor wafer. This technique may utilize a conventional wafer to fabricate PiN cell and an array of such cells (e.g. solar panel). This method is simpler than that described above in that it does not require vertical cutting of the wafer (silicon disc). This technique inter alia allows for solving the problems that might be faced when using PiN cells produced by vertical cut of the conventional wafer, namely "broken corners" at the P- and N-doped surfaces, and defects in the metallization coatings.

According to this technique, a semiconductor (silicon) ingot is sliced laterally into thinner wafers of a thickness of about 0.2-1.5 mm dimension (similar to the wafer's preparation in the conventional silicon industry). Generally, the wafer thickness is determined by the relationship between the silicon thickness and the anticipated absorption spectrum for the PiN structure. For example, the maximum absorbing wavelength ($\lambda_{max}$) of silicon with an energy gap (Eg) of 1.1 eV is 1.12 μm ($\lambda_{max}$=1.24/Eg). Hence, silicon can absorb photon radiation from λ=1.12 μm and downward (covering the visible range of the spectrum). For germanium (Ge) with a band gap Eg=0.67 eV, $\lambda_{max}$ equals to 1.85 μm, which is much deeper to the far infra red (FIR) of the spectrum. As $\lambda_{max}$ increases, the absorbing thickness of the semiconductor increases as well.

Figure 11A:
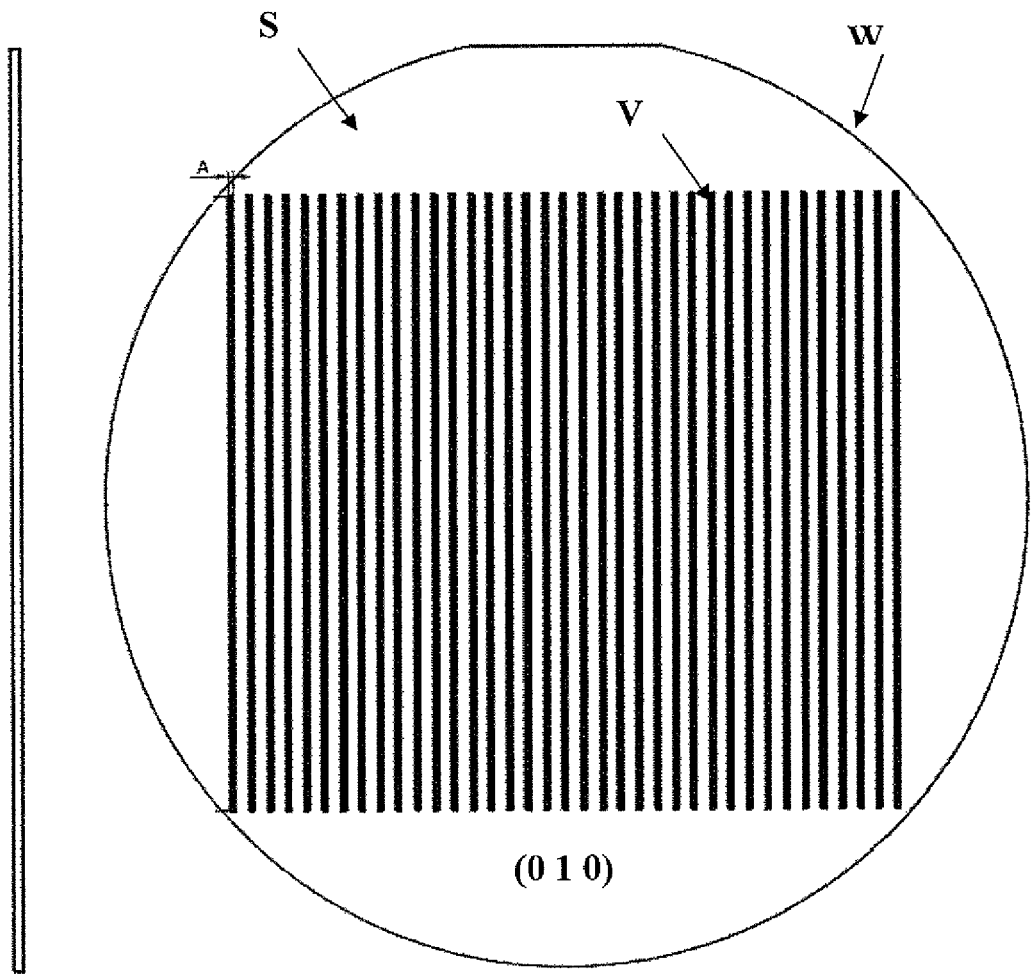
Figure 11B:
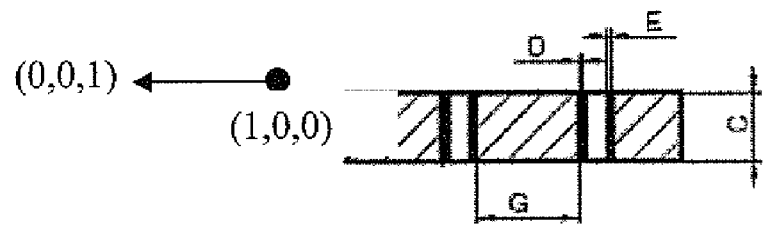

As shown in FIG. 11A, a wafer W (of a thickness of about 0.2-1.5 mm dimension) is etched into grooves, generally at V, from a top surface (being for example a crystallographic plane (0,1,0)) almost to the bottom of the wafer. Each groove V has a width A in a range of about 0.02-1 mm. Referring to FIG. 11B, it is shown that the grooves are spaced from one another a distance G (e.g. between 1.0 mm to 50 mm), which defines the width of the PiN cell (a distance between the P- and N-doped regions). As indicated above, the width of the intrinsic semiconductor (of the light collection surface) in the cell defines the cell's output power, and in the case of multiple cells array, this is a total width formed by all the cells.

As also shown in FIG. 11B, the grooves are made in a spaced-apart parallel relationship being parallel to the crystallographic plane (1,0,0) and perpendicular to the (0,0,1) plane to thereby provide high mobility of the charged carriers.

Figure 11C:
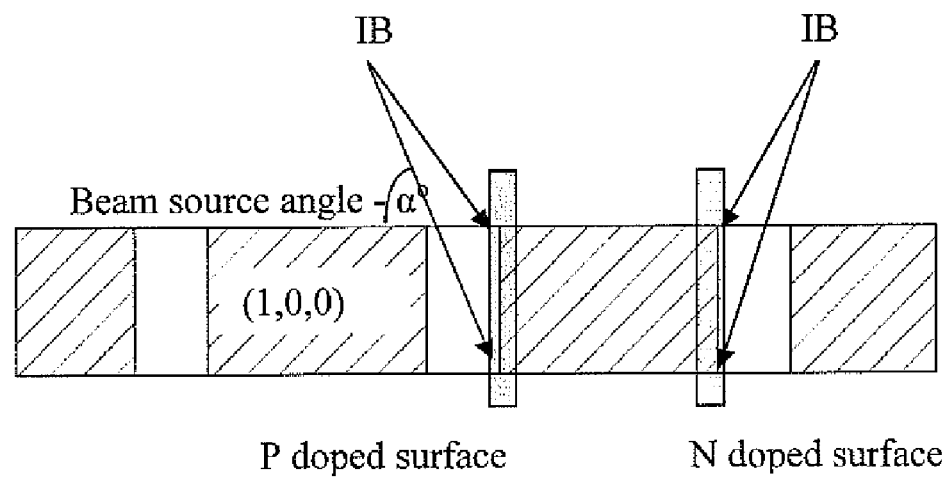

Referring to FIG. 11C, it is shown that vertical side walls of each groove (i.e. between each two vertical cuts) are P- and N-doped. For example, doping may be achieved by ion implantation method. An ion beam IB may be tilted to a certain angle α° with respect to the groove's wall, allowing for a full coverage of the vertical wall.

The Dopant materials can be arbitrarily chosen, for example Boron being used for p-doping and Phosphorous for n-doping. Doping concentration of each dopant is preferably of about $10^{19}$-$10^{21}$ atoms/cm³, which is the degenerated level of concentration (maximum possible doping). A typical width ($a_2$, $a_3$ in FIG. 2B) of the doped layer may be in a range of about 0.5-3.0 μm. The doping process may be done in two steps using photolithographic masks: one mask for the $n^+$ doping and the other mask for the $p^+$ doping.

Metallization processes, following the $p^+$ and $n^+$ doping steps, are illustrated in FIGS. 11D and 11E. These processes provide Ohmic contacts which enable efficient collection of charge carriers from both sides of the PiN cell. Metallization may be carried out using several techniques, such as sputtering or thermal deposition. Since different metals are required for various dopants. As illustrated in FIGS. 11D and 11E, the metallization processes may be configured to provide metallization layers 108, 110 covering only the doped surfaces 102C and 102D, or optionally covering also additional parts of the perpendicular wall PW. As shown in these figures, the metallization (108, 110) in a groove V2 (gap) between the PiN cells 2 and 3 is configured to cover only the doped side surfaces (102C and 102D) of the PiN cells 2 and 3 facing this groove (V2), while the metallization (108, 110) in the groove V1 between the PiN cells 1 and 2 is configured to cover also parts of the perpendicular wall of this groove (V1). To this end, although not specifically shown in the figure, the metallization in the groove V1 can be configured to extend over the perpendicular wall PW in this groove such as to provide electrical contact (in series) between the PiN cells 1 and 2. Alternatively or additionally, metallization process may be concurrently used for creating electrical connection (in series) of each individual cell to another cell, which is not necessarily a locally adjacent one. To this end, conductors are deposited using photolithographic methods similar to those of the microelectronics industry.

Figure 11F:
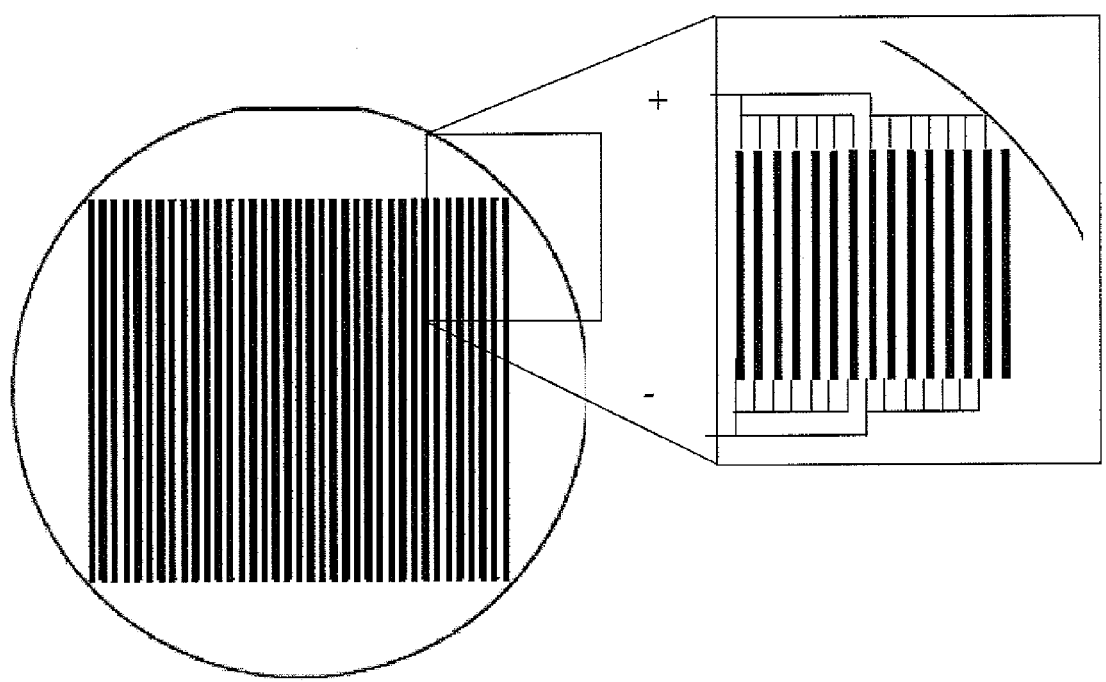
FIG. 11F exemplify how the above technique of FIGS. 11A-11E can be used to design various cell configurations based on any specific application of the cell, by using same wafer for various output power by changing the configuration of the cell connections.

The above-described fabrication method enables to design various cell configurations based on any specific application of the cell. For example, the same wafer can be used for various output power, just by changing the configuration of the cell connections, as shown schematically in FIG. 11F. In case diodes are used to shortcut mal/non functioning cell, the PiN diode of the present invention can be manufactured as part of the wafer by standard semiconductor manufacturing methods (oxidation, lithography, diffusion, ion implantation and metallization).

Figure 12:
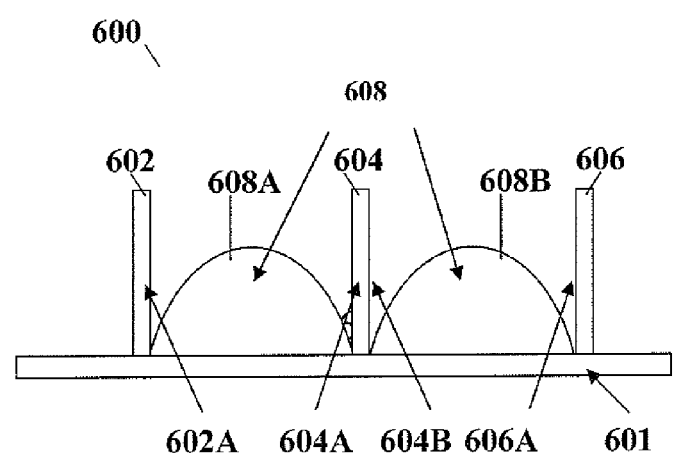
FIG. 12 exemplifies a photoelectric device of the present invention having multiple photoelectric structures/cell and reflectors between them.

Reference is made to FIG. 12, showing yet further example of a photoelectric device 600 of the present invention. The device 600 includes a plurality of PiN structures, each formed by one or more bi-facial PiN cells, three such structures 602, 604 and 606 being shown in the figure, arranged in a spaced-apart relationship on a support structure 601. The structures/cells may be configured as either one of the above-described examples. Also provided in device 600 is a reflector arrangement 608 including a certain number of reflecting surfaces, two such reflectors 608A and 608B being shown in the figured, accommodated in the spaces between the PiN structures. The reflecting surfaces 608A and 608B are appropriately curved such that each surface reflects radiation incident thereon towards the radiation collection surfaces of the PiN structures at both sides of said reflecting surface. Thus, reflecting surface 608A reflects radiation towards PiN the light collection surfaces 602A and 604A of PiN structures 602 and 604, and reflecting surface 608B reflects radiation towards the other light collection surface 604B of PiN structure 604 and towards light collection surface 606A of the PiN structure 606. Although the figure exemplifies spherical reflecting surfaces it should be understood that the invention is not limited to this specific example, and any other curved surface can be used.

Thus, the present invention provides a novel PiN structure formed by one or multiple PiN cells utilizing an intrinsic semiconductor as the active region of the cell. The invention may be used in various applications, including but not limited to solar cells, photodetectors, photodiodes, optical sensors, etc.

While this invention has been particularly shown and described with references to preferred embodiments thereof, it will be understood by those skilled in the art that various changes in form and details may be made therein without departing from the scope of the invention encompassed by the appended claims.

What is claimed is:

1. A photoelectric structure comprises one or more PiN cell, wherein the PiN cell is formed by an intrinsic semiconductor bulk having front and rear surfaces enclosed between p- and n-type regions extending along side surfaces of said semiconductor bulk; the front and rear surfaces of the intrinsic semiconductor bulk being active surfaces of the PiN cell and said side surfaces of said semiconductor bulk formed with said p- and n-type regions being configured and operable for collecting excess charged carriers generated in said semiconductor bulk in response to collected electromagnetic radiation to which at least one of the active surfaces is exposed during the PiN cell operation.

2. The photoelectric structure of claim 1, wherein said p- and n-type regions on the side surfaces are configured and operable for creating an internal lateral electric field to enable collecting the excess charged carriers generated in said semiconductor bulk in response to the electromagnetic radiation collected through said at least one of the front and rear surfaces while said semiconductor bulk is being subjected to said lateral electric field.

3. The photoelectric structure of claim 2, wherein a level of doping of said p- and n-type regions and a width of said intrinsic semiconductor bulk in between said p- and n-type regions are selected to create the lateral internal electric field of the order of $10^5$ V/cm in said intrinsic semiconductor bulk, to enable drift of the charged carriers into Ohmic contacts at the p- and n-type regions.

4. The photoelectric structure of claim 1, wherein a major axis of the PiN cell, being an axis of highest mobility of the charge carriers in the semiconductor bulk, is substantially parallel to said at least one light collection surface and is thus substantially perpendicular to a general propagation direction of light to which said PiN cell is exposed.

5. The photoelectric structure of claim 2, wherein a major axis of the PiN cell, being an axis along a direction of said internal lateral field, is substantially perpendicular to said at least one light collection surface and thus substantially perpendicular to a general propagation direction of light to which said PiN cell is exposed.

6. The photoelectric structure of claim 2, wherein a major axis of the PiN cell, being an axis intersecting the p- and n-type regions, is substantially parallel to said at least one light collection surface.

7. The photoelectric structure of claim 2, wherein a major axis of the PiN cell, being an axis along a direction of said internal lateral field, is substantially parallel to a main crystallographic axis of the semiconductor bulk, said intrinsic semiconductor bulk being a single-crystalline structure in either one of 100, 010 and 001 orientations.

8. The photoelectric structure of claim 1, wherein said p- and n-type regions are associated with Ohmic-type contacts.

9. The photoelectric structure of claim 2, wherein a width of each of the p-type and n-type regions is in a range of 0.5-3 μm, the p-type and n-type regions being heavily doped having a dopant concentration of about $10^{19}$-$10^{21}$ cm$^{-3}$, such that said internal lateral electrical field in the vicinity of said side surfaces is high enough to attract the generated excess charged carriers towards and collection at said p-type and n-type regions.

10. The photoelectric structure of claim 1, wherein a ratio between a width of each of the front and rear surfaces of said intrinsic semiconductor bulk and a width of each of said p- and n-type lateral regions is at least 1000.

11. The photoelectric structure of claim 10, wherein said PiN cell has a substantially rectangular geometry, the width of each of the front and rear surfaces of said intrinsic semiconductor bulk is about 0.5-50 cm and the width of each of said p- and n-type lateral regions is in a range of about 0.5 to 3 μm.

12. The photoelectric structure of claim 1, wherein both of said front and rear surfaces are the active surfaces of the PiN cell, said photoelectric structure being thereby configured and operable for bi-facial light collection.

13. The structure of claim 1, wherein the PiN cells comprises an array of PiN cells having the semiconductor bulks made of one or more semiconductor materials having substantially the same or different energy band gaps absorbing substantially the same or different spectral parts of the electromagnetic radiation.

14. The photoelectric structure of claim 13, wherein at least some of said PiN cells are electrically connected to one another, and said array of the PiN cells comprises at least one of the following arrangement of PiN cells: (i) cells arranged in a spaced-apart relationship along a common plane, and (ii) cells arranged one on top of the other interfacing via the active surfaces thereof.

15. The photoelectric structure of claim 1, comprising an array of the PiN cells located one on top of the other interfacing via the active surfaces thereof, wherein the intrinsic semiconductor bulks of the cells are kept one on top of the other by thermo-conductive glue layers, materials of the semiconductor bulks and the glue layers are selected to provide a predetermined refractive index profile through the structure.

16. The photoelectric structure of claim 13, wherein said different energy band gaps of the semiconductor bulks are selected such that the electromagnetic radiation spectrum is substantially entirely covered in equal parts by the PiN cells of said array.

17. The photoelectric structure of claim 13, wherein at least some of the PiN cells are integral within a common semiconductor wafer.

18. A photoelectric device comprising at least two photoelectric structures accommodated in a spaced-apart relationship, each structure being configured according to claim 1; and a reflector arrangement comprising a predetermined number of reflecting surfaces arranged such that the reflecting surface is accommodated in a space between each two locally adjacent photoelectric structures, the reflecting surface being curved to reflect electromagnetic radiation incident thereon towards two light collection surfaces of the photoelectric structures, respectively, at opposite sides of said reflecting surface.

19. A photoelectric structure comprises one or more PiN cell, wherein the PiN cell comprises an intrinsic semiconductor layer presenting an active region of the cell and having relatively wide front and rear surfaces, which are enclosed between relatively narrow p- and n-type regions extending along side surfaces of said semiconductor layer; the front and rear surfaces of the intrinsic semiconductor layer being active surfaces of the PiN cell and said side surfaces of said semiconductor layer formed with said p- and n-type regions being configured and operable for creating an internal lateral electric field to enable collection of excess charged carriers generated in said intrinsic semiconductor layer in response to collected electromagnetic radiation to which at least one of the active surfaces is exposed during the PiN cell operation, a major axis of the PiN cell, which is an axis along a direction of said internal lateral field, being substantially perpendicular to said at least one active surface and thus substantially perpendicular to a general propagation direction of light to which said PiN cell is exposed.

* * * * *